(12) United States Patent
Davies et al.

(10) Patent No.: US 7,003,066 B1
(45) Date of Patent: Feb. 21, 2006

(54) DIGITAL PHASE LOCKED LOOP WITH PHASE SELECTOR HAVING MINIMIZED NUMBER OF PHASE INTERPOLATORS

(75) Inventors: Antony Davies, Campbell, CA (US); Chienkuang Chen, Sunnyvale, CA (US); Ling Wang, Sunnyvale, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 765 days.

(21) Appl. No.: 10/006,559

(22) Filed: Dec. 3, 2001

(51) Int. Cl.
*H03D 3/24* (2006.01)

(52) U.S. Cl. .................. 375/376; 375/374; 375/375

(58) Field of Classification Search .............. 375/372, 375/376, 215, 371, 373, 374, 375
See application file for complete search history.

(56) References Cited

U.S. PATENT DOCUMENTS

| | | | | |
|---|---|---|---|---|
| 5,604,775 A | * | 2/1997 | Saitoh et al. ............. | 375/376 |
| 5,991,341 A | * | 11/1999 | Shin ....................... | 375/265 |
| 6,041,080 A | * | 3/2000 | Fraisse ................... | 375/242 |
| 6,122,336 A | * | 9/2000 | Anderson ................ | 375/371 |
| 2002/0027886 A1 | * | 3/2002 | Fischer et al. ........... | 370/255 |
| 2002/0042836 A1 | * | 4/2002 | Mallory .................... | 709/232 |
| 2003/0212930 A1 | * | 11/2003 | Aung et al. .............. | 714/700 |

OTHER PUBLICATIONS

PCT Publication No. WO 01/69837 A2, published Sep. 20, 2001, Clock Data Recovery Circuit Associated with Programmable Logic Device Circuitry.

* cited by examiner

*Primary Examiner*—Jean Corrielus
*Assistant Examiner*—Qutub Ghulamali

(57) ABSTRACT

In one embodiment of the invention, a phase selection unit for generating a recovered clock signal (SCLK), a phase select signal generator generates a phase select signals in response to a FWD signal and a BWD signal from a digital filter. The digital filter asserts the FWD signal if the phase of a SDIN (serial digital input) signal leads the phase of the recovered clock signal, and asserts the BWD signal if the phase of the SDIN (serial digital input) signal lags the phase of the recovered clock signal. A multiplexer receives a number of given clock signals arranged in a predetermined phase order and outputs selected first and second output clock signals, each being one of the given clock signals. A phase interpolator receives the selected first and second output clock signals from the multiplexer to generate the recovered clock signal having a phase that is phase interpolated between the phases of the first and second output clock signals.

18 Claims, 16 Drawing Sheets

| Asserted Select Signal | PSA | PSB | Phase of SCLK |
|---|---|---|---|
| S1 | $HCLK_1$ | $HCLK_1$ | $\angle HCLK_1$ |
| S2 | $HCLK_1$ | $HCLK_2$ | Average of $\angle HCLK_1 + \angle HCLK_2$ |
| S3 | $HCLK_2$ | $HCLK_2$ | $\angle HCLK_2$ |
| S4 | $HCLK_2$ | $HCLK_3$ | Average of $\angle HCLK_2 + \angle HCLK_3$ |
| S5 | $HCLK_3$ | $HCLK_3$ | $\angle HCLK_3$ |
| S6 | $HCLK_3$ | $HCLK_4$ | Average of $\angle HCLK_3 + \angle HCLK_4$ |
| S7 | $HCLK_4$ | $HCLK_4$ | $\angle HCLK_4$ |
| S8 | $HCLK_4$ | $HCLK_5$ | Average of $\angle HCLK_4 + \angle HCLK_5$ |
| S9 | $HCLK_5$ | $HCLK_5$ | $\angle HCLK_5$ |
| S10 | $HCLK_5$ | $HCLK_6$ | Average of $\angle HCLK_5 + \angle HCLK_6$ |
| S11 | $HCLK_6$ | $HCLK_6$ | $\angle HCLK_6$ |
| S12 | $HCLK_6$ | $HCLK_7$ | Average of $\angle HCLK_6 + \angle HCLK_7$ |
| S13 | $HCLK_7$ | $HCLK_7$ | $\angle HCLK_7$ |
| S14 | $HCLK_7$ | $HCLK_8$ | Average of $\angle HCLK_7 + \angle HCLK_8$ |
| S15 | $HCLK_8$ | $HCLK_8$ | $\angle HCLK_8$ |
| S16 | $HCLK_8$ | $HCLK_1$ | Average of $\angle HCLK_8 + \angle HCLK_1$ |

FIG. 16

| Asserted Select Signal | PAA | PAB | Phase of ACLK |
|---|---|---|---|
| S1 | $HCLK'_1$ | $HCLK'_1$ | $\angle HCLK'_1$ |
| S2 | $HCLK'_1$ | $HCLK'_2$ | Average of $\angle HCLK'_1 + \angle HCLK'_2$ |
| S3 | $HCLK'_2$ | $HCLK'_2$ | $\angle HCLK'_2$ |
| S4 | $HCLK'_2$ | $HCLK'_3$ | Average of $\angle HCLK'_2 + \angle HCLK'_3$ |
| S5 | $HCLK'_3$ | $HCLK'_3$ | $\angle HCLK'_3$ |
| S6 | $HCLK'_3$ | $HCLK'_4$ | Average of $\angle HCLK'_3 + \angle HCLK'_4$ |
| S7 | $HCLK'_4$ | $HCLK'_4$ | $\angle HCLK'_4$ |
| S8 | $HCLK'_4$ | $HCLK'_5$ | Average of $\angle HCLK'_4 + \angle HCLK'_5$ |
| S9 | $HCLK'_5$ | $HCLK'_5$ | $\angle HCLK'_5$ |
| S10 | $HCLK'_5$ | $HCLK'_6$ | Average of $\angle HCLK'_5 + \angle HCLK'_6$ |
| S11 | $HCLK'_6$ | $HCLK'_6$ | $\angle HCLK'_6$ |
| S12 | $HCLK'_6$ | $HCLK'_7$ | Average of $\angle HCLK'_6 + \angle HCLK'_7$ |
| S13 | $HCLK'_7$ | $HCLK'_7$ | $\angle HCLK'_7$ |
| S14 | $HCLK'_7$ | $HCLK'_8$ | Average of $\angle HCLK'_7 + \angle HCLK'_8$ |
| S15 | $HCLK'_8$ | $HCLK'_8$ | $\angle HCLK'_8$ |
| S16 | $HCLK'_8$ | $HCLK'_1$ | Average of $\angle HCLK'_8 + \angle HCLK'_1$ |

*FIG. 17*

DIGITAL PHASE LOCKED LOOP WITH PHASE SELECTOR HAVING MINIMIZED NUMBER OF PHASE INTERPOLATORS

BACKGROUND OF THE INVENTION

1. Field of the Invention

The present invention relates generally to SERDES (serializer/deserializer) transceivers, and more particularly, to a phase selector within a digital phase locked loop for generating a recovered serial clock signal with a minimized number of phase interpolators for in turn minimizing consumption of power and chip-space.

2. Discussion of the Related Art

FIG. 1 shows a conventional SERDES (serializer/deserializer) transceiver 100 coupled between a high speed data communication media 102 and a low speed data processor 104. The high speed data communication media 102 is for sending serial data bits to the low speed data processor 104 at relatively high speeds. The low speed data processor 104 then receives and processes such data at a lower speed. For example, the high speed data communication media 102 may be a network of optical fibre channels operating at the relatively high speed of 1.25 GHz (giga-Hertz) for instance, and the low speed data processor 104 may be a computer system for processing such data received from the high speed data communication media 102. Such high speed data communication media 102 and such low speed data processor 104 are known to one of ordinary skill in the art of SERDES transceivers.

Within the SERDES transceiver 100, a clock data recovery deserializer 106 receives a high speed serial data input (SDIN) from the high speed data communication media 102 and recovers an embedded serial clock signal (SCLK) from the high speed serial data input (SDIN). The clock data recovery deserializer 106 uses a plurality of given clock signals ($HCLK_{1-n}$) generated by a clock synthesizer phase locked loop 108 to recover the serial clock signal (SCLK). The clock synthesizer phase locked loop 108 generates each of the plurality of given clock signals ($HCLK_{1-n}$) from a reference clock signal (REFCLK) provided by the low speed data processor 104. Each of the plurality of given clock signals ($HCLK_{1-n}$) has a substantially same frequency that is an expected frequency of the recovered serial clock signal (SCLK) of the high speed serial data input (SDIN) but has different phases from each other.

In addition, the clock data recovery deserializer 106 uses the recovered serial clock signal (SCLK) to sample the high speed serial data input (SDIN) for generating a v-bits wide recovered parallel data output (RPDO) for every cycle of a recovered parallel clock signal (RPCLK). The recovered parallel clock signal is generated for every v-cycles of the recovered serial clock signal (SCLK). The recovered parallel data output (RPDO) and the recovered parallel clock signal (RPCLK) are sent from the clock data recovery deserializer 106 to the low speed data processor 104 for further processing of such data at relatively slower speeds by the low speed data processor 104.

The reference clock signal (REFCLK) from the low speed data processor 104 and the recovered parallel clock signal (RPCLK) have a substantially same frequency since the ratio of the frequency of the recovered serial clock signal (SCLK) to the frequency of the reference clock signal (REFCLK) or to the frequency of the recovered parallel clock signal (RPCLK) is substantially same. The ratio of the frequency of the recovered serial clock signal (SCLK) to the frequency of the reference clock signal (REFCLK) or to the frequency of the recovered parallel clock signal (RPCLK) is "v" with the recovered parallel data output (RPDO) being "v"-bits wide. However, the phase of the reference clock signal (REFCLK) may differ from the phase of the recovered parallel clock signal (RPCLK) since the recovered parallel clock signal (RPCLK) is synchronized with the output of the v-bits wide recovered parallel data output (RPDO).

On the transmitting side, a transmit serializer 110 receives a v-bits wide transmitted parallel data input (TPDIN) and the reference clock signal (REFCLK) from the low speed data processor 104. The reference clock signal (REFCLK) is synchronized with the v-bits wide transmitted parallel data input (TPDIN). The transmit serializer 110 uses the higher frequency of a given clock signal (HCLK) from the clock synthesizer phase locked loop 108 to convert the v-bits wide transmitted parallel data input (TPDIN) to a high speed serial data output (SDOUT) to be transmitted over the high speed data communication media 102. The high speed serial data output (SDOUT) is transmitted as serial data bits at the higher speed of the given clock signal (HCLK) which has a substantially same frequency as the recovered serial clock signal (SCLK).

Such a SERDES transceiver 100 and such operations and components 106, 108, and 110 of the SERDES transceiver 100 are known to one of ordinary skill in the art of high speed data communications.

FIG. 2 shows the components of the clock data recovery deserializer 106 of FIG. 1. A clock recovery phase locked loop 112 inputs the high speed serial data input (SDIN) and generates the recovered serial clock signal (SCLK). The recovered serial clock signal (SCLK) is input by a clock divider 114 and a serial-to-parallel shift register 116. The serial-to-parallel shift register 116 shifts in a bit of the high speed serial data input (SDIN) every cycle of the recovered serial clock signal (SCLK).

The clock divider generates the recovered parallel clock signal (RPCLK) having a cycle for every "v" cycles of the recovered serial clock signal (SCLK). The recovered parallel clock signal (RPCLK) is input by the serial-to-parallel shift register 116 to generate the recovered parallel data output (RPDO) comprised of v-bits of the high speed serial data input (SDIN) at a predetermined transition of every cycle of the recovered parallel clock signal (RPCLK). A SYNC detect logic 118 asserts a VRS (diVider ReSet) signal (i.e., a parallel clock enabling signal) for determining the timing of such a predetermined transition of every cycle of the recovered parallel clock signal (RPCLK) such that the high speed serial data input (SDIN) is properly partitioned to generate each of the v-bits of the recovered parallel data output (RPDO). The SYNC detect logic 118 inputs the high speed serial data input (SDIN) and asserts the VRS signal at the occurrence of a predetermined bit pattern within the high speed serial data input (SDIN).

Such a clock data recovery deserializer 106 and such operations and components 112, 114, 116, and 118 of the clock data recovery deserializer 106 are known to one of ordinary skill in the art of SERDES transceivers.

FIG. 3 shows a timing diagram of an example high speed serial data input (SDIN) 101, an example recovered serial clock signal (SCLK) 103, and examples of possible recovered parallel clock signals (RPCLK). The cross-hatched region of the high speed serial data input (SDIN) 101 represents a time period when the high speed serial data input (SDIN) 101 may make a transition, and the time period between the cross-hatched regions represents a time period when the high speed serial data input (SDIN) 101 has a stable data bit, including a first data bit 105, a second data bit 107, a third data bit 109, a fourth data bit 111, and a fifth data bit 113. The example recovered serial clock signal (SCLK) 103 represents a desired recovered serial clock signal (SCLK) with each low-to-high transition of the recovered serial clock signal (SCLK) 103 occurring substantially at the middle of each stable data bit of the high speed serial data input (SDIN) 101 (as illustrated by dashed line 115 for example in FIG. 3).

Referring to FIGS. 2 and 3, assume that the recovered parallel data output (RPDO) is comprised of three-bits, and that the proper partitioning of three data bits in FIG. 3 is to include the first, second, and third data bits 105, 107, and 109. For such three data bits, a first recovered parallel clock signal ($RPCLK_1$) 117, a second recovered parallel clock signal ($RPCLK_2$) 119, and a third recovered parallel clock signal ($RPCLK_3$) 121 are possible. If the three data bits after the low-to-high transition of the recovered parallel clock signal (RPCLK) is to comprise the three-bits of the recovered parallel data output (RPDO), then for a cycle 123 of the first recovered parallel clock signal ($RPCLK_1$) 117, the recovered parallel data output (RPDO) is comprised of the first, second, and third data bits 105, 107, and 109. On the other hand, for a cycle 125 of the second recovered parallel clock signal ($RPCLK_2$) 119, the recovered parallel data output (RPDO) is comprised of the second, third, and fourth data bits 107, 109, and 111. For a cycle 127 of the third recovered parallel clock signal ($RPCLK_3$) 121, the recovered parallel data output (RPDO) is comprised of the third, fourth, and fifth data bits 109, 111, and 113.

Thus, if the proper partitioning of the high speed serial data input (SDIN) 101 is to include the three-bits of the first, second, and third data bits 105, 107, and 109, then the first recovered parallel clock signal ($RPCLK_1$) 117 is the desired one of the possible first, second, and third recovered parallel clock signals ($RPCLK_1$, $RPCLK_2$, and $RPCLK_3$) 117, 119, and 121. The VRS signal from the SYNC detect logic 118 determines the time of occurrence of the low-to-high transition of the recovered parallel clock signal (RPCLK) to ensure that the first recovered parallel clock signal ($RPCLK_1$) 117 (instead of the second or third possible recovered parallel clock signals $RPCLK_2$ and $RPCLK_3$) is the recovered parallel clock signal (RPCLK) sent to the serial-to-parallel shift register 116.

The SYNC detect logic 118 asserts the VRS signal at the occurrence of a predetermined synchronization bit pattern within the high speed serial data input (SDIN). One of the drawbacks of conventional SERDES transceivers is their inability to recognize synchronization bit patterns of different communications protocols. In prior art SERDES transceivers, the SYNC detect logic is constructed to recognize only a single synchronization bit pattern. Different communications protocols, however, have different synchronization bit patterns. A SERDES transceiver having such prior art SYNC detect logic 118 cannot receive and process high speed serial data input (SDIN) having different synchronization bit patterns.

Another drawback of conventional SERDES transceivers is their inability to minimize bit error rates for different communications protocols. FIG. 4 shows the prior art components of the clock recovery phase locked loop 112 of FIG. 2 including a phase detector 120, a digital filter 122, and a phase selector 124 for generating the recovered serial clock signal (SCLK) from the high speed serial data input (SDIN). The phase selector 124 inputs the given clock signals ($HCLK_{1-n}$) from the clock synthesizer phase locked loop 108 of FIG. 1 and selects one of such given clock signals as the recovered serial clock signal (SCLK). The phase selector 124 selects one of the given clock signals ($HCLK_{1-n}$) as the recovered serial clock signal (SCLK) depending on the values of a FWD signal and a BWD signal generated by the digital filter 122.

FIG. 5 shows a timing diagram of an example high speed serial data input (SDIN) 130 and an example recovered serial clock signal (SCLK) 134. A complementary recovered serial clock signal (ACLK) 132 is the recovered serial clock signal (SCLK) 134 that is 180° phase-shifted. The cross-hatched region of the high speed serial data input (SDIN) 130 represents a transition time period when the high speed serial data input (SDIN) 130 may make a transition, and the time period between the cross-hatched regions represents a stable data time period when the high speed serial data input (SDIN) 130 has a stable data bit.

For the desired recovered serial clock signal (SCLK) 134 and the desired complementary recovered serial clock signal (ACLK) 132, each low-to-high transition of the complementary recovered serial clock signal (ACLK) 132 occurs substantially at the middle of the cross-hatched region representing the transition time period when the high speed serial data input (SDIN) 130 makes a transition (illustrated by dashed line 133 in FIG. 5). Conversely, each low-to-high transition of the recovered serial clock signal (SCLK) 134 occurs substantially at the middle of the region representing the stable data time period when the high speed serial data input (SDIN) 130 has a stable data bit (illustrated by dashed line 135 in FIG. 5).

FIG. 5 also shows example given clock signals ($HCLK_{1-n}$) from the clock synthesizer phase locked loop 108 of FIG. 1 including a first given clock signal $HCLK_1$ 136, a second given clock signal $HCLK_2$ 138, a third given clock signal $HCLK_3$ 140, a fourth given clock signal $HCLK_4$ 142, a fifth given clock signal $HCLK_5$ 144, a sixth given clock signal $HCLK_6$ 146, a seventh given clock signal $HCLK_7$ 148, and an eighth given clock signal $HCLK_8$ 150. Each of the given clock signals ($HCLK_{1-n}$) are arranged in a predetermined phase order such that any two adjacent given clock signals ($HCLK_j$ and $HCLK_{j+1}$) have a substantially same predetermined phase difference. In addition, the first given clock signal $HCLK_1$ 136 and the eighth given clock signal $HCLK_8$ 150 which is the last of the given clock signals ($HCLK_{1-n}$) in the phase order in the example of FIG. 5 has that substantially same predetermined phase difference. Thus, the example given clock signals ($HCLK_{1-n}$) of FIG. 5 have a successive phase difference of 45°.

If the FWD signal is asserted by the digital filter 122, then the phase selector 124 selects another clock signal ($HCLK_{j+1}$) of the given clock signals that immediately leads a priorly selected one ($HCLK_j$) of the given clock signals as the recovered serial clock signal (SCLK). If the BWD signal is asserted by the digital filter 122, then the phase selector 124 selects another clock signal ($HCLK_{j-1}$) of the given clock signals that immediately lags the priorly selected one ($HCLK_j$) of the given clock signals as the recovered serial clock signal (SCLK). If neither the FWD signal nor the BWD signal is asserted, then the phase selector 124 selects the priorly selected one ($HCLK_j$) of the given clock signals to remain as the recovered serial clock signal (SCLK). In the example of FIG. 5, eventually, the seventh given clock signal $HCLK_7$ is selected as the desired recovered serial clock signal (SCLK) 134, and the third given clock signal $HCLK_3$ is selected as the desired complementary recovered serial clock signal (ACLK) 132.

The phase detector 120 inputs the high speed serial data input (SDIN) and compares the phase of the high speed serial data input (SDIN) to the phase of the recovered serial clock signal (SCLK) from the phase selector 124. The phase detector 120 generates a DN signal pulse if the high speed serial data input (SDIN) leads the recovered serial clock signal (SCLK) and generates an UP signal pulse if the high speed serial data input (SDIN) lags the recovered serial clock signal (SCLK). The digital filter 122 counts the number of such UP signal pulses to assert the FWD signal after generation of at least a predetermined number of UP signal pulses or to assert the BWD signal after generation of at least a predetermined number of DN signal pulses. Such a clock recovery phase locked loop 112 which is a digital phase locked loop and such operations and components 120, 122, and 124 of the clock recovery phase locked loop 112 are known to one of ordinary skill in the art of SERDES transceivers.

Assertion of the FWD signal or the BWD signal by the digital filter 122 after counting such UP signal pulses or DN signal pulses to at least the predetermined number ensures that the FWD signal or the BWD signal is asserted only when the high speed serial data input (SDIN) significantly leads or lags the recovered serial clock signal (SCLK). In this manner, the FWD signal or the BWD signal is not asserted when the high speed serial data input (SDIN) leads or lags the recovered serial clock signal (SCLK) only because of temporary glitches or noise.

In addition, the digital filter 122 determines an average (i.e., a trend) of whether the high speed serial data input (SDIN) leads or lags the recovered serial clock signal (SCLK) by counting such UP signal pulses or DN signal pulses to at least the predetermined number. When the phase detector 120 generates the UP signal pulses and the DN signal pulses by comparing the transitions of the high speed serial data input (SDIN) to the transitions of the recovered serial clock signal (SCLK), the predetermined number of the UP signal pulses and the DN signal pulses that the digital filter 122 counts up to for asserting the FWD signal or the BWD signal determines the bit error rate of the SERDES transceiver 100, as known to one of ordinary skill in the art of SERDES transceivers.

In the prior art digital filter 122, this predetermined number of the UP signal pulses and the DN signal pulses that the digital filter 122 counts up to for asserting the FWD signal or the BWD signal is fixed. However, each communications protocol has a respective optimum range of the predetermined number of UP signal pulses and the DN signal pulses that the digital filter counts up to for asserting the FWD signal or the BWD signal such that the bit error rate is minimized for each communications protocol. When the predetermined number of UP signal pulses and the DN signal pulses that the digital filter 122 counts up to for asserting the FWD signal or the BWD signal is fixed for a predetermined communications protocol, the SERDES transceiver having such a prior art digital filter 122 cannot be used for receiving and processing high speed serial data input (SDIN) of another communications protocol with minimized bit error rate for that other communications protocol.

In the prior art, another SERDES transceiver having a digital filter that counts to a different predetermined number of the UP signal pulses and the DN signal pulses for asserting the FWD signal or the BWD signal needs to be manufactured to minimize the bit error rate of another communications protocol. However, such manufacture of various SERDES transceiver to accommodate different communications protocols may be costly. Nevertheless, the high speed serial data input (SDIN) may be communicated according to multiple communications protocols.

A third drawback of conventional SERDES transceivers is their inability to provide additional phases of the recovered clock signal (SCLK) without minimized consumption of increased chip area and power since each additional phase interpolator consumes additional chip area and power.

SUMMARY

Accordingly, in a general aspect of the present invention, a DPLL (digital phase locked loop) for generating a recovered clock signal is implemented with a minimized number of phase interpolators for in turn minimizing consumption of chip area and power.

In one example embodiment, the DPLL includes a phase detector operable to compare a serial data input (SDIN) with a recovered clock signal (SCLK) and to generate in response up and down signals. In addition, a digital filter is coupled to the phase detector and operable to generate FWD (forward) and BWD (backward) signals in response to the up and down signals. Furthermore, a phase selector is coupled to the digital filter and includes a phase interpolator coupled to a multiplexer responsive to the FWD and BWD signals. The multiplexer is operable to receive a plurality of given clock signals having different phases as inputs and selects each of at least two clock signals as one of the given clock signals as outputs. The phase interpolator is operable to generate a recovered clock signal (SCLK) having a phase that is phase interpolated between the phases of the at least two selected clock signals.

In another embodiment of the present invention, a phase selector of the DPLL for generating a recovered clock signal includes a phase select signal generator for generating a plurality of phase select signals in response to a FWD signal and a BWD signal from a digital filter. The digital filter asserts the FWD signal if the phase of a SDIN (serial digital input) signal leads the phase of the recovered clock signal and asserts the BWD signal if the phase of the SDIN (serial digital input) signal lags the phase of the recovered clock signal. A multiplexer inputs a predetermined number of given clock signals arranged in a predetermined phase order and outputs a first output clock signal and a second output clock signal with the first and second output clock signals each being one of the given clock signals. A phase interpolator receives the first and second output clock signals from the multiplexer to generate the recovered clock signal having a phase that is phase interpolated between the phases of the first and second output clock signals. A multiplexer select control controls the multiplexer to select one of the given clock signals for each of the first and second output clock signals, depending on whether the phase select signals indicates that the FWD signal is asserted or that the BWD signal is asserted such that the phase of the recovered clock signal generated from the phase interpolator increases when the FWD signal is asserted and decreases when the BWD signal is asserted and remains substantially constant when the FWD signal and the BWD signal are not asserted.

In this manner, because the clock signals that are input to the phase interpolator are selected first, only one phase interpolator may advantageously be used for generating the recovered clock signal with the phase selector of an embodiment of the present invention. With such a minimized number of phase interpolators of the phase selector, the chip area and the power consumed by the phase selector is minimized.

These and other features and advantages of the present invention will be better understood by considering the following detailed description of the invention which is presented with the attached drawings.

BRIEF DESCRIPTION OF THE DRAWINGS

FIG. 16 shows a table of input clock signals and the output clock signal for a first phase interpolator for generating the recovered serial clock signal (SCLK), according to one embodiment of the present invention;

FIG. 17 shows a table of input clock signals and the output clock signal for a second phase interpolator for generating the complementary recovered serial clock signal (ACLK), according to one embodiment of the present invention;

The figures referred to herein are drawn for clarity of illustration and are not necessarily drawn to scale. Elements having the same reference number in FIGS. 1, 2, 3, 4, 5, 6, 7, 8, 9, 10, 11, 12, 13, 14, 15, 16, 17, 18, 19, 20, 21, and 22 refer to elements having similar structure and function.

DETAILED DESCRIPTION

Figure 5:
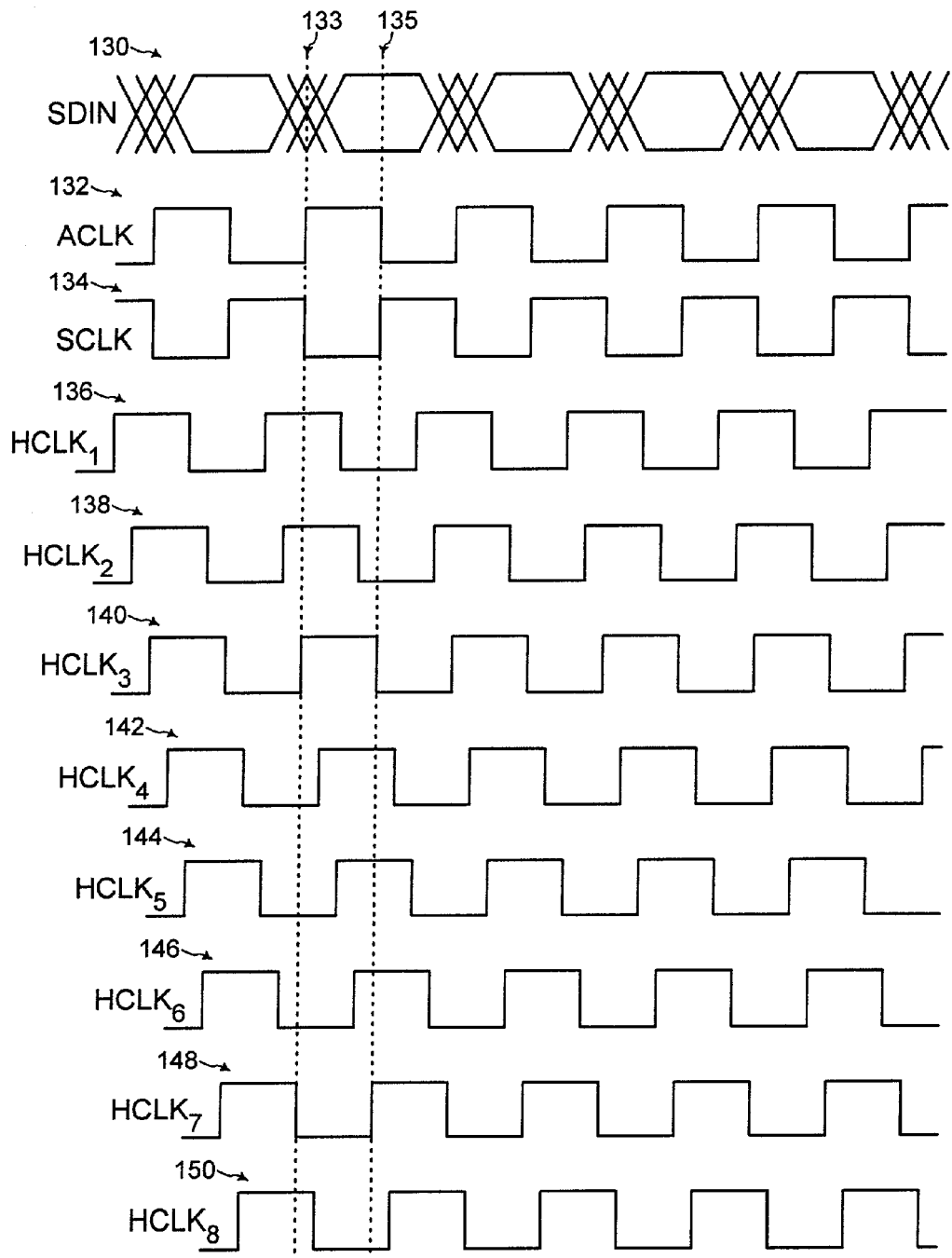
FIG. 5 shows an example timing diagram illustrating generation of the recovered serial clock signal (SCLK) by selecting one of a plurality of given clock signals ($HCLK_{1-n}$), according to the prior art.
Figure 6:
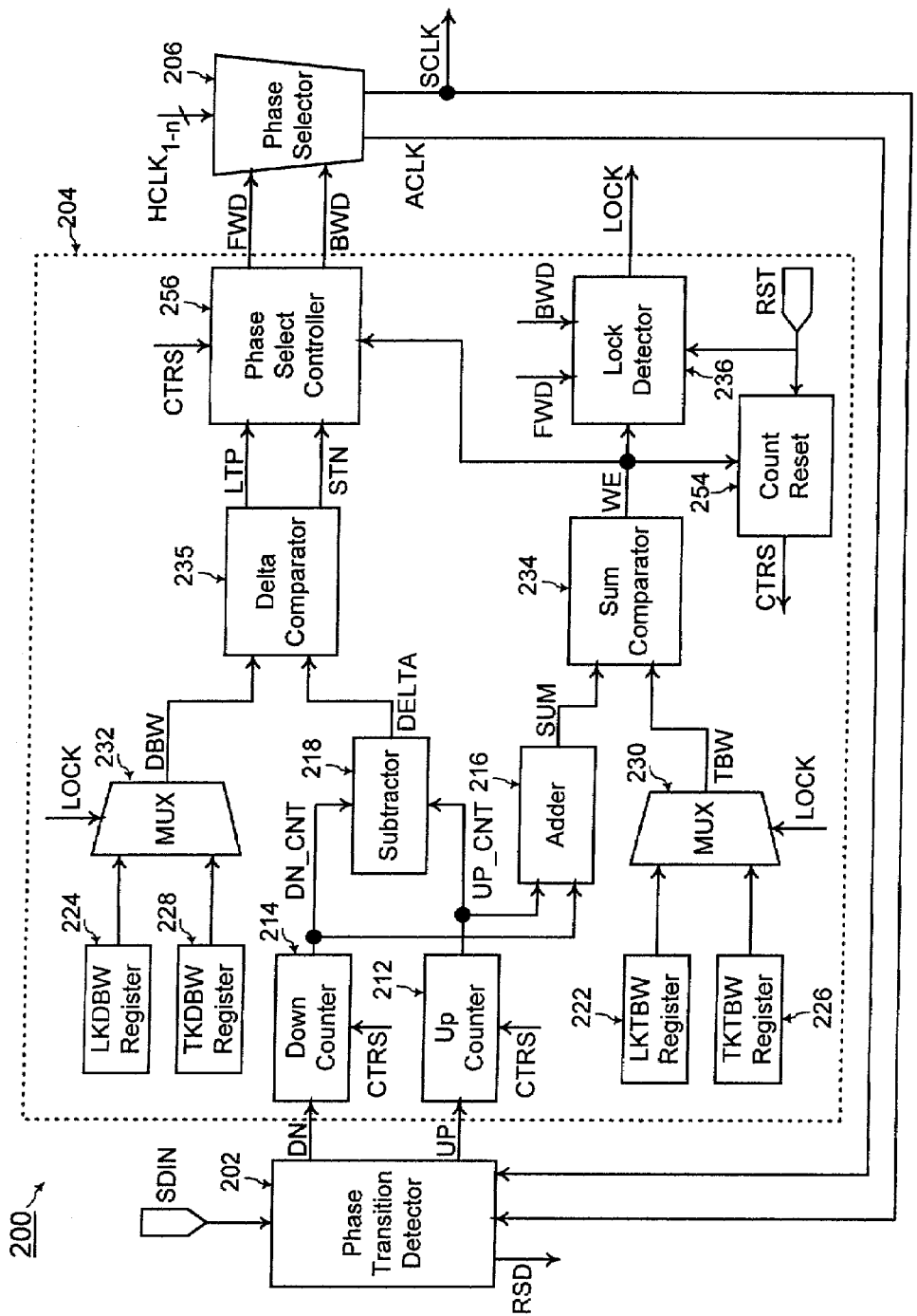
FIG. 6 shows block diagram components of a digital filter having programmable bandwidth parameters for minimizing the bit error rate for high speed serial data input (SDIN) of multiple communications protocols, according to one aspect of the present invention.

Referring to FIG. 6, a clock recovery phase locked loop 200 of an embodiment of the present invention includes a phase transition detector 202, a digital filter 204, and a phase selector 206. The phase selector 206 receives a predetermined number of given clock signals ($HCLK_{1-n}$) such as the given clock signals ($HCLK_{1-n}$) of FIG. 5 and generates the recovered serial clock signal (SCLK) and the complementary recovered clock signal (ACLK) that is 180° phase shifted from the recovered serial clock signal (SCLK).

Figure 8:
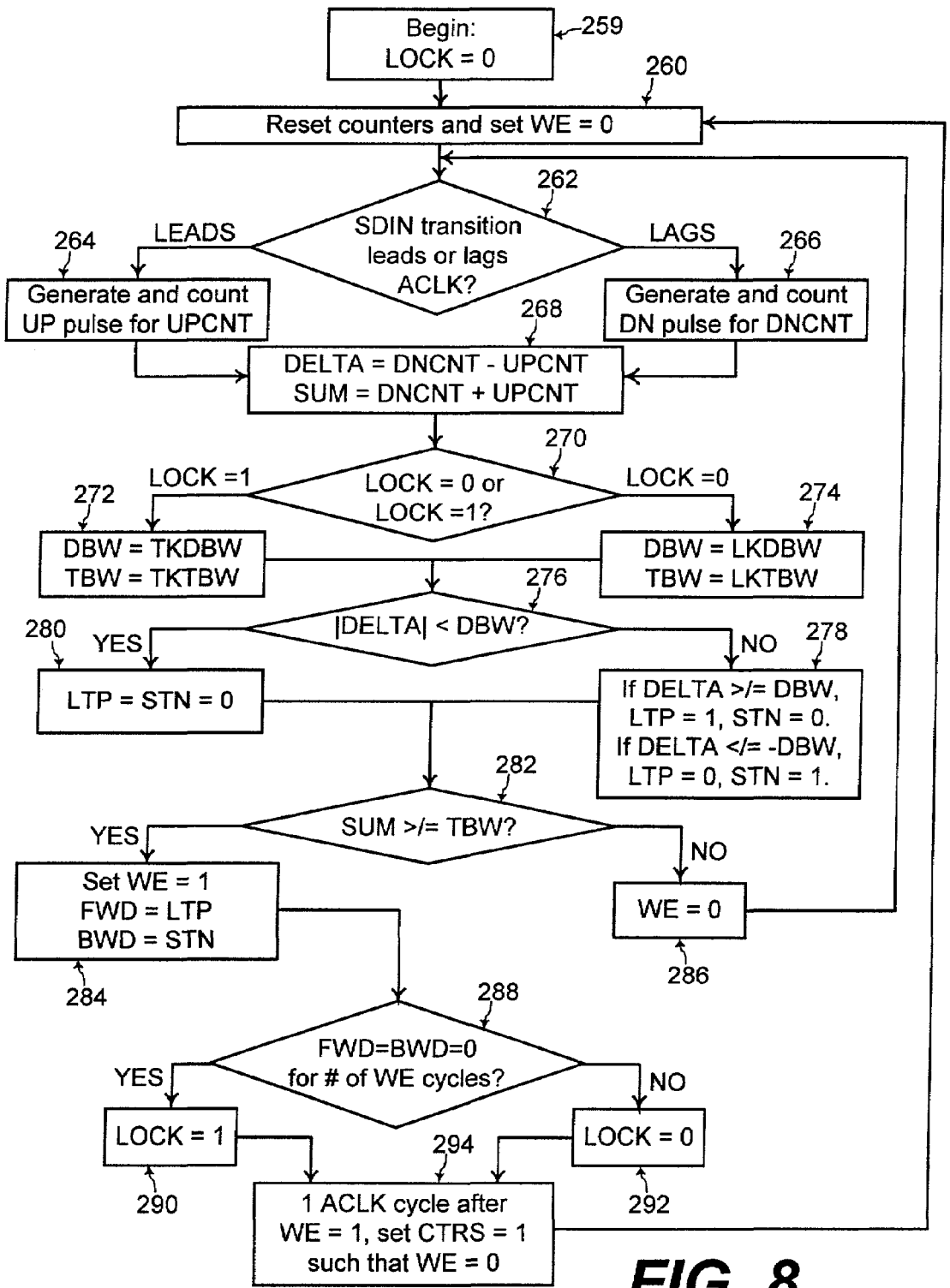
FIG. 8 shows a flow chart during operation of the digital filter of FIG. 6, according to an embodiment of the present invention.

Referring to FIGS. 6 and 8, the components of the digital filter 204 (shown within dashed lines in FIG. 6) of an embodiment of the present invention and the phase transition detector 202 operate according to the flow chart of FIG. 8. The phase transition detector 202 inputs the high speed serial data input (SDIN), the recovered serial clock signal (SCLK), and the complementary recovered clock signal (ACLK). The high speed serial data input (SDIN), the recovered serial clock signal (SCLK), and the complementary recovered clock signal (ACLK) have the desired phase relation of FIG. 5. Each low-to-high transition of the recovered serial clock signal (SCLK) is desirably centered about a stable data bit of the high speed serial data input (SDIN) (as illustrated by dashed line 135 in FIG. 5). Each low-to-high transition of the complementary recovered serial clock signal (ACLK) is desirably centered about a transition time period when the high speed serial data input (SDIN) may make a transition (as illustrated by dashed line 133 in FIG. 5).

The phase transition detector 202 compares the timing of such transitions of the recovered serial clock signal (SCLK) and the complementary recovered clock signal (ACLK) and the transitions of the high speed serial data input (SDIN) to generate an UP signal pulse or a DN signal pulse (step 262 of FIG. 8). The phase transition detector 202 generates an UP signal pulse when the phase of the high speed serial data input (SDIN) leads the phase of the complementary recovered clock signal (ACLK) (step 264 of FIG. 8) and generates a DN signal pulse when the phase of the high speed serial data input (SDIN) lags the phase of the complementary recovered clock signal (ACLK) (step 266 of FIG. 8). Implementation for such a phase transition detector 202 is known to one of ordinary skill in the art of electronics.

In addition, implementation of the phase transition detector 202 for generating a recovered serial data (RSD) is known to one of ordinary skill in the art of electronics. The recovered serial data (RSD) is the high speed serial data input (SDIN) sampled at every cycle of the recovered serial clock signal (SCLK). Thus, the recovered serial data (RSD) is ideally substantially same as the high speed serial data input (SDIN). Mechanisms within the phase transition detector 202 for sampling a data signal with a clock signal to generate the recovered serial data (RSD) are known to one of ordinary skill in the art.

The digital filter 204 includes an up_counter 212 for counting up each UP signal pulse from the phase transition detector 202 to generate an UP_CNT value (step 264 of FIG. 8). Similarly, a down_counter 214 counts up each DN signal pulse from the phase transition detector 202 to generate a DN_CNT value (step 266 of FIG. 8). Referring to FIG. 8, at start of operation of the digital filter 204, a LOCK signal is reset to be unasserted at a logical low "0" state (step 259 of FIG. 8), and at that point, the phase selector 206 selects one of the given clock signals ($HCLK_{1-n}$) as the initial SCLK signal and one of the given clock signals ($HCLK_{1-n}$) as the initial ACLK signal. In addition, the up_counter 212 and the down_counter 214 are reset to zero (step 260 of FIG. 8). Implementation of counters for counting signal pulses are known to one of ordinary skill in the art of electronics.

An adder 216 adds the UP_CNT value from the up_counter 212 and the DN_CNT value from the down_counter 214 to generate a SUM value (i.e., SUM=UP_CNT+DN_CNT) (step 268 of FIG. 8). A subtractor 218 subtracts the UP_CNT value from the DN_CNT value to generate a DELTA value (i.e., DELTA=DN_CNT−UP_CNT) (step 268 of FIG. 8). Implementation of adders and subtractor are known to one of ordinary skill in the art of electronics.

In addition, the digital filter 204 of an embodiment of the present invention includes a plurality of reloadable register portions including a first LK (lock) reloadable register portion 222, a second LK (lock) reloadable register portion 224, a first TK (track) reloadable register portion 226, and a second TK (track) reloadable register portion 228. The first LK reloadable register portion 222 stores a LKTBW (lock total bandwidth) value, and the second LK reloadable register portion 224 stores a LKDBW (lock differential bandwidth) value. Similarly, the first TK reloadable register portion 226 stores a TKTBW (track total bandwidth) value, and the second TK reloadable register portion 228 stores a LKDBW (lock differential bandwidth) value.

Figure 7:
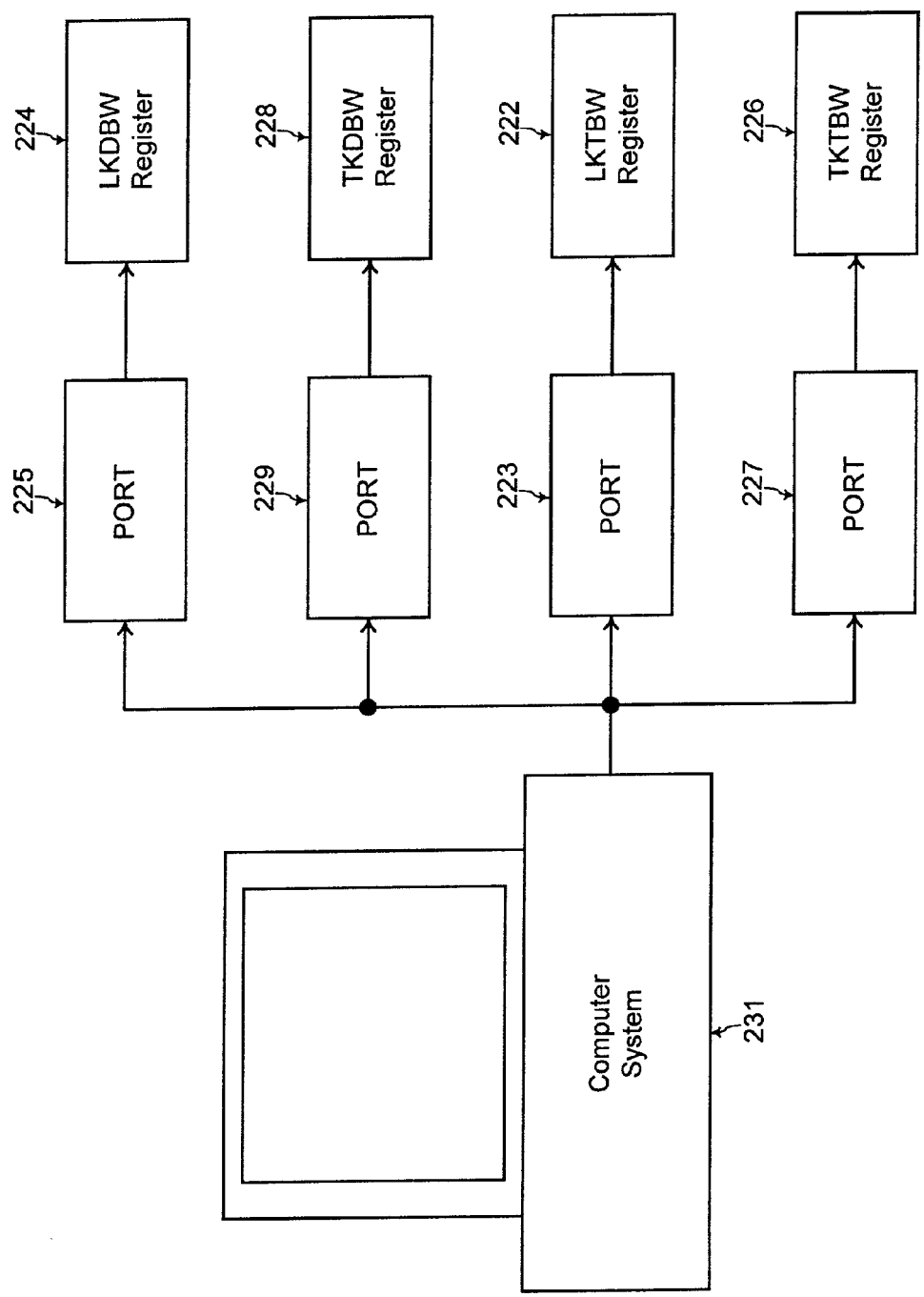
FIG. 7 shows further block diagram components for the digital filter of FIG. 6 for programming the bandwidth parameters by software from a computer system, according to one embodiment of the present invention.

Referring to FIG. 7, the first LK reloadable register portion 222 is capable of being coupled to a first LK port 223 for inputting the LKTBW value programmed into the first LK reloadable register portion 222 through the first LK port 223. The second LK reloadable register portion 224 is capable of being coupled to a second LK port 225 for inputting the LKDBW value programmed into the second LK reloadable register portion 224 through the second LK port 225. The first TK reloadable register portion 226 is capable of being coupled to a first TK port 227 for inputting the TKTBW value programmed into the first TK reloadable register portion 226 through the first TK port 227. The second TK reloadable register portion 228 is capable of being coupled to a second TK port 229 for inputting the TKDBW value programmed into the second TK reloadable register portion 228 through the second TK port 229.

Further referring to FIG. 7, in one embodiment of the present invention, the LKTBW value, the LKDBW value, the TKTBW value, and the TKDBW value are programmed into the first LK reloadable register portion 222, the second LK reloadable register portion 224, the first TK reloadable register portion 226, and the second TK reloadable register portion 228, respectively, through the first LK port 223, the second LK port 225, the first TK port 227, and the second TK port 229, respectively, by software from a computer system 231. The first LK reloadable register portion 222, the second LK reloadable register portion 224, the first TK reloadable register portion 226, and the second TK reloadable register portion 228 may generally be comprised of any type of data storage device known to one of ordinary skill in the art of electronics.

Computer systems and programming values into data storage devices with computer systems through ports are known to one of ordinary skill in the art of electronics. An example of such software for programming the LKTBW value, the LKDBW value, the TKTBW value, and the TKDBW value into the reloadable registers 222, 224, 226, and 228, respectively, from the computer system 231 is the "ispDOWNLOAD" software application commercially known and available to one of ordinary skill in the art of electronics from Lattice Semiconductor Corp. headquartered in Hillsboro, Oreg.

Referring back to FIGS. 6 and 8, a first multiplexer 230 sets a TBW (total bandwidth) value to the LKTBW value stored in the first LK reloadable register portion 222 when a LOCK signal is not asserted (steps 270 and 274 of FIG. 8) and to the TKTBW value stored in the first TK reloadable register portion 226 when the LOCK signal is asserted (steps 270 and 272 of FIG. 8). A second multiplexer 232 sets a DBW (differential bandwidth) value to the LKDBW value stored in the second LK reloadable register portion 224 when the LOCK signal is not asserted (steps 270 and 274 of FIG. 8) and to the TKDBW value stored in the second TK reloadable register portion 228 when the LOCK signal is asserted (steps 270 and 272 of FIG. 8). Implementation of multiplexers are known to one of ordinary skill in the art of electronics.

A delta comparator 235 compares the DELTA value from the subtractor 218 with the DBW value from the second multiplexer 232 and asserts one of a LTP (larger than positive) signal or a STN (smaller than negative) signal (step 276 of FIG. 8). Implementation of comparators for the delta comparator 235 is known to one of ordinary skill in the art of electronics. If the magnitude of the DELTA value is greater than or equal to the DBW value and if the DOWN_CNT value is greater than the UP_CNT value such that the DELTA value is a positive number, then the LTP signal is asserted (i.e., the LTP signal is asserted as a logical high state "1" in step 278 of FIG. 8). Otherwise, the LTP signal is not asserted if the magnitude of the DELTA value is not greater than the DBW value (step 280 of FIG. 8) or if the DOWN_CNT value is not greater than the UP_CNT value (i.e., the LTP signal remains as a logical low state "0").

If the magnitude of the DELTA value is greater than or equal to the DBW value and if the DOWN_CNT value is less than the UP_CNT value such that the DELTA value is a negative number, then the STN signal is asserted (i.e., the STN signal is asserted as a logical high state "1" in step 278 of FIG. 8). Otherwise, the STN signal is not asserted if the magnitude of the DELTA value is not greater than the DBW value (step 280 of FIG. 8) or if the DOWN_CNT value is not less than the UP_CNT value (i.e., the STN remains as a logical low state "0").

A sum comparator 234 compares the SUM value from the adder 216 to the TBW value from the first multiplexer 230 (step 282 of FIG. 8) and asserts a WE (write enable) signal when the SUM value is greater than or equal to the TBW value (step 284 of FIG. 8). Implementation of comparators for the sum comparator 234 is known to one of ordinary skill in the art of electronics. Referring to FIG. 8, at start of operation of the digital filter 204, the WE signal is reset to not be asserted (i.e., a logical low state "0" in step 260 of FIG. 8). When the SUM value is less than the TBW value, the WE signal is not asserted to remain at the logical low state "0" (step 286 of FIG. 8). In that case, operation of the digital filter 204 returns to step 262 to repeat steps 262, 264, 266, 268, 270, 272, 274, 276, 278, 280, and 282 for each UP signal pulse or each DN signal pulse generated by the phase transition detector 202 until the WE signal is asserted.

If the WE signal is asserted by the sum comparator 234, then a FWD (forward) signal is set to the value of the LTP signal by a phase select controller 256, and a BWD (backward) signal is set to the value of the STN signal by the phase select controller 256 (step 284 of FIG. 8). Implementation of logic for the phase select controller 256 is known to one of ordinary skill in the art of electronics. The FWD signal and the BWD signal from the phase select controller 256 are input by the phase selector 206.

If the FWD signal is asserted, the phase selector 206 generates a new ACLK signal from the given clock signals (HCLK$_{1-n}$) having a leading phase from a current ACLK signal as a new ACLK signal and generates a new SCLK signal from the given clock signals (HCLK$_{1-n}$) having a leading phase from a current SCLK signal as a new SCLK signal. If the BWD signal is asserted, the phase selector 206 generates a new ACLK signal from the given clock signals (HCLK$_{1-n}$) having a lagging phase from a current ACLK signal as a new ACLK signal and generates a new SCLK signal from the given clock signals (HCLK$_{1-n}$) having a lagging phase from a current SCLK signal as a new SCLK signal. If neither the FWD signal nor the BWD signal is asserted, the phase selector 206 generates the new ACLK signal to remain as the current ACLK signal and generates the new SCLK signal to remain as the current SCLK signal.

Further referring to FIGS. 6 and 8, when the WE signal is asserted, if the FWD signal and the BWD signal remain not asserted for a predetermined number of WE cycles (i.e., for a predetermined number of cycles of repeating steps 260, 262, 264, 266, 268, 270, 272, 274, 276, 278, 280, 282, and 284), then the LOCK signal is asserted as a logical high state "1" by a lock detector 236 (steps 288 and 290 of FIG. 8).

Otherwise, the LOCK signal remains not asserted as a logical low state "0" by the lock detector 236 since LOCK was initially set to the logical low state "0" at step 259 of FIG. 8 with the start of operation of the clock recovery phase locked loop 200 (steps 288 and 292 of FIG. 8). Implementation of logic circuitry for the lock detector 236 is known to one of ordinary skill in the art of electronics.

Figure 9:
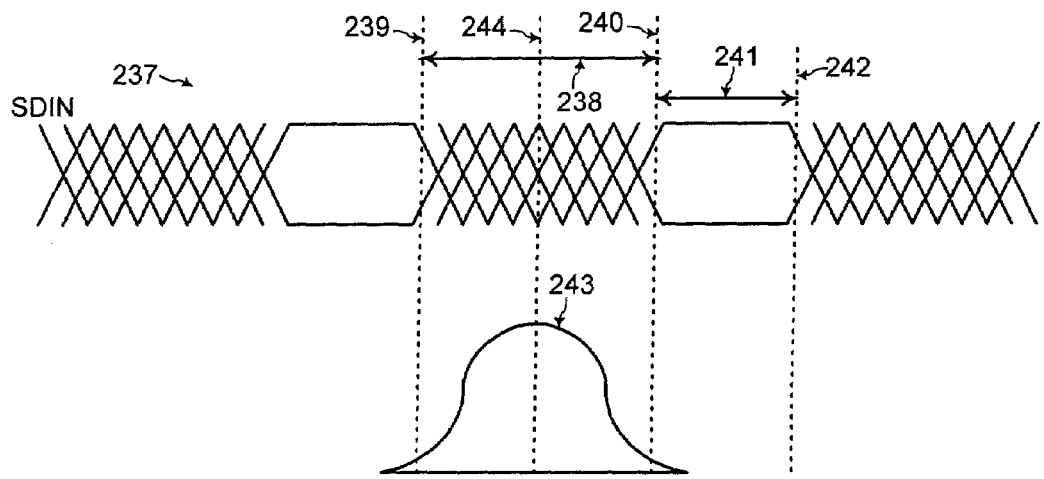
FIG. 9 illustrates a Gaussian distribution of the probability of occurrences of a data transition within a relatively large transition time period of the high speed serial data input (SDIN), as the digital filter of FIG. 6 operates in a tracking mode.
Figure 10:
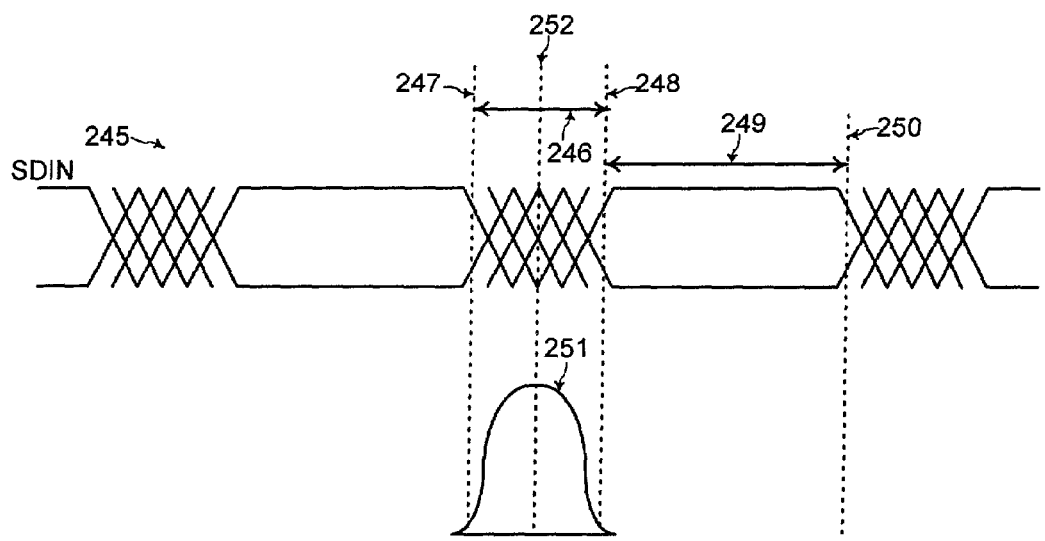
FIG. 10 illustrates a Gaussian distribution of the probability of occurrences of a data transition within a relatively small transition time period of the high speed serial data input (SDIN), as the digital filter of FIG. 6 operates in a locking mode.

When the LOCK signal is asserted as a logical high state "1", the digital filter 204 operates in tracking (i.e., locked) mode. When the LOCK signal is not asserted to remain at the logical low state "0", the digital filter 204 operates in locking mode. FIGS. 9 and 10 illustrate such tracking and locking modes. FIG. 9 has a high speed serial data input (SDIN) signal portion 237 with an example transition time period 238 for making transitions between stable bits between time points 239 and 240. An example stable data time period 241 when the data bit is stable is between time points 240 and 242.

A graph 243 illustrates the probability of the occurrence of the data transition at each time point within the transition time period 238. Such a graph 243 is a Gaussian distribution with the average being at a middle time point 244 of the transition time period 238 as known to one of ordinary skill in the art of SERDES transceivers. In FIG. 9, the ratio of the transition time period 238 to the total time period of the transition time period 238 and the stable data time period 241 is relatively large such as 0.7 for example. Thus, the Gaussian distribution 243 has a relatively large spread (i.e., a relatively large standard deviation).

In contrast, FIG. 10 illustrates a high speed serial data input (SDIN) signal portion 245 with an example transition time period 246 for making transitions between stable bits between time points 247 and 248. An example stable data time period 249 when the data bit is stable is between time points 248 and 250. A graph 251 illustrates the probability of the occurrence of the data transition at each time point within the transition time period 246. Such a graph 251 is a Gaussian distribution with the average being at a middle time point 252 of the transition time period 246 as known to one of ordinary skill in the art of SERDES transceivers. In FIG. 10, the ratio of the transition time period 246 to the total time period of the transition time period 246 and the stable data time period 249 is relatively small such as 0.3 for example. Thus, the Gaussian distribution 251 has a relatively narrow spread (i.e., a relatively small standard deviation).

Typically, the high speed serial data input (SDIN) signal portion 237 of FIG. 9 and the high speed serial data input (SDIN) signal portion 245 of FIG. 10 are part of a same high speed serial data input (SDIN). However, the high speed serial data input (SDIN) signal portion 245 of FIG. 10 with the narrower spread Gaussian distribution 251 is sent toward the beginning such that the digital filter 204 locks in relatively quickly.

The LKDBW value is smaller than the TKDBW value, and the LKTBW value is smaller than the TKTBW value, both smaller by about 50% for example. The DBW value and the TBW value are smaller for the smaller spread Gaussian distribution 251 of FIG. 10 for faster locking in of the ACLK and the SCLK to the high speed serial data input (SDIN). The high speed serial data input (SDIN) signal portion 245 of FIG. 10 with the narrower spread Gaussian distribution 251 is sent first. Thus, the digital filter 204 initially operates in locking mode (i.e., LOCK=0) with the DBW value set to the LKDBW value and with the TBW value set to the LKTBW value. Once, the digital filter 204 locks in with the LOCK signal being set to the logical high state "1", the digital filter 204 operates in tracking mode (i.e., LOCK=1) with the DBW value set to the TKDBW value and with the TBW value set to the TKTBW value since the high speed serial data input (SDIN) later has the larger spread Gaussian distribution 243 of FIG. 9.

In any case, one ACLK cycle after the WE signal is asserted, a count reset unit 254 asserts a CTRS (count reset) signal (step 294 of FIG. 8) such that operation of the clock recovery phase locked loop 200 returns to step 260 in FIG. 8. Alternatively, the count reset unit 254 also asserts the CTRS signal when a RST (reset) signal is asserted manually typically at step 260 of FIG. 8 at the start of operation of the digital filter 204. Implementation of such a count reset unit 254 is known to one of ordinary skill in the art of electronics. The CTRS signal from the count reset unit 254 is coupled to the up_counter 212, the down_counter 214, and the phase select controller 256. When the CTRS signal from the count reset unit 254 is asserted, the UP_CNT value within the up_counter 212 and the DN_CNT value within the down_counter 214 are reset to zero. Thus, the WE signal becomes not asserted to the logical low state "0". In addition, the FWD signal and the BWD signal from the phase select controller 256 are reset to a logical low state "0".

Figure 1:
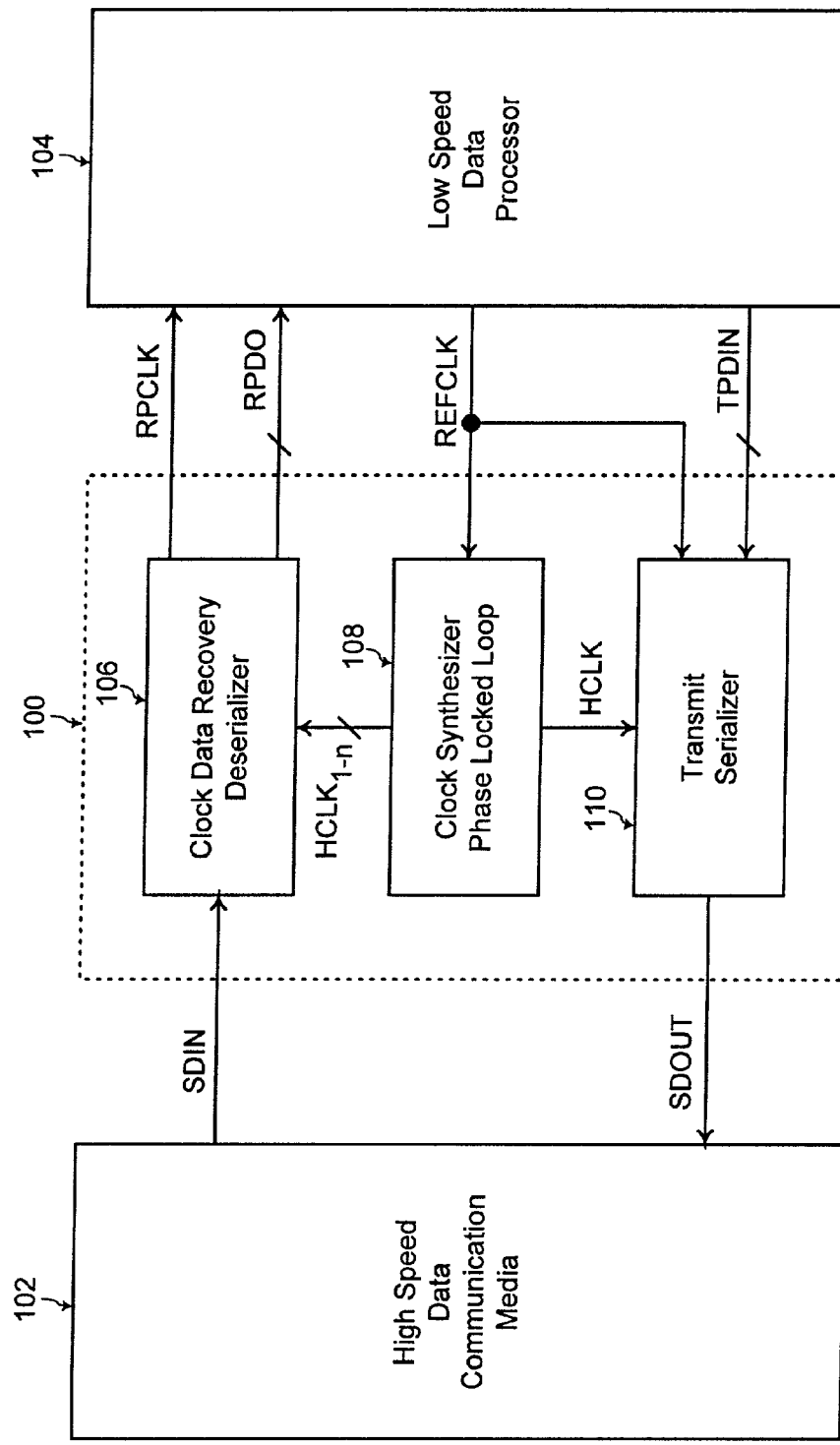
FIG. 1 shows block diagram components of a SERDES (serializer/deserializer) transceiver as known in the prior art.
Figure 2:
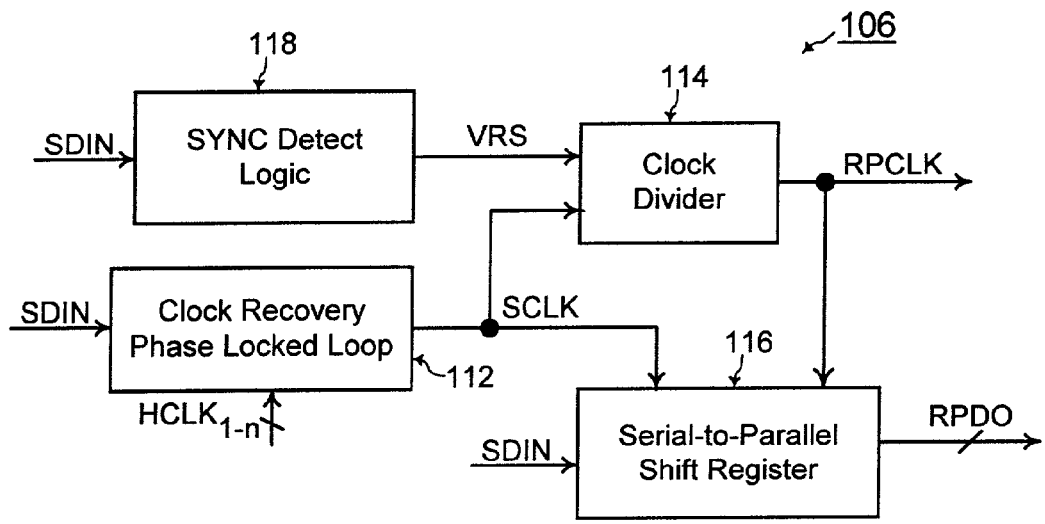
FIG. 2 shows block diagram components of a clock data recovery deserializer of the SERDES transceiver of FIG. 1, according to the prior art.
Figure 4:
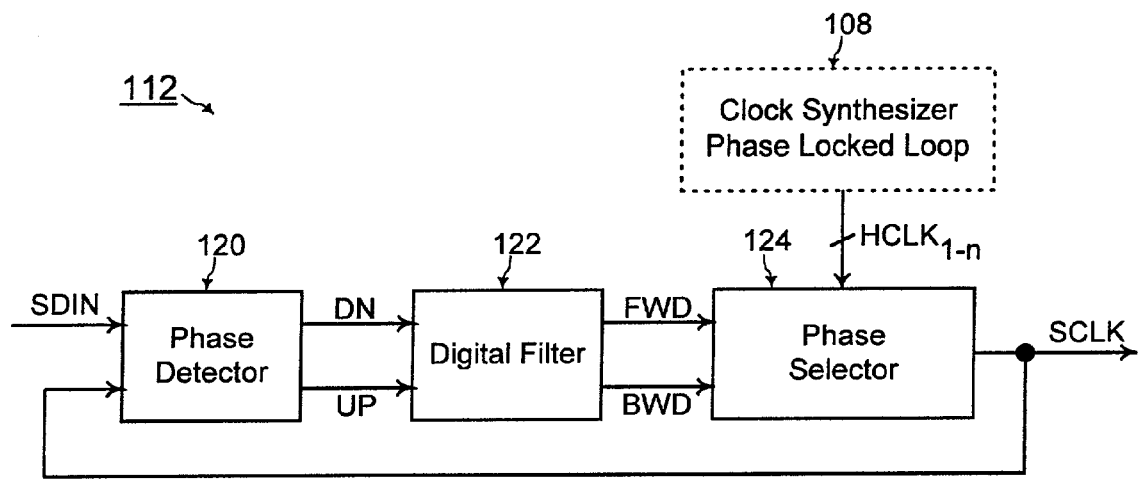
FIG. 4 shows block diagram components of a clock recovery phase locked loop of the clock data recovery deserializer of FIG. 2, according to the prior art.

When the clock data recovery deserializer 200 of FIG. 6 is used within the SERDES transceiver 100 of FIG. 1, the DBW value and the TBW value are bandwidth parameters of the digital filter 204 that determine the bit error rate of the recovered parallel data output (RPDO) of the SERDES transceiver 100. An optimum range of the DBW value and of the TBW value for minimizing the bit error rate varies depending on the communications protocol used for sending the high speed serial data input (SDIN). Referring to FIGS. 6 and 7, with the digital filter 204, different LKDBW, TKDBW, LKTBW, and TKTBW values are programmable for minimizing the bit error rate depending on the communications protocol used for sending the high speed serial data input (SDIN). Thus, the SERDES transceiver having the digital filter 204 may be used to accommodate multiple communications protocols.

It will be understood by those of skill in the art that the foregoing description is only exemplary of the invention and is not intended to limit its application to the structure and operation described herein. Many of the components can be implemented in hardware or software and in discrete or integrated circuits. Additionally, the bandwidth parameters may be programmable into the reloadable registers 222, 224, 226, and 228 by any means known to one of ordinary skill in the art of electronics. Furthermore, the present invention may be practiced when the reloadable registers 222, 224, 226, and 228 are any types of data storage device known to one of ordinary skill in the art of electronics. The present invention may be practiced when the reloadable registers 222, 224, 226, and 228 each are part of a respective separate data storage device or each are integral portions of a same data storage device, as would be apparent to one of ordinary skill in the art of electronics from the description herein. In addition, the timing diagram of FIG. 5 is by way of example only, and the present invention may be practiced with other example signals.

Figure 11:
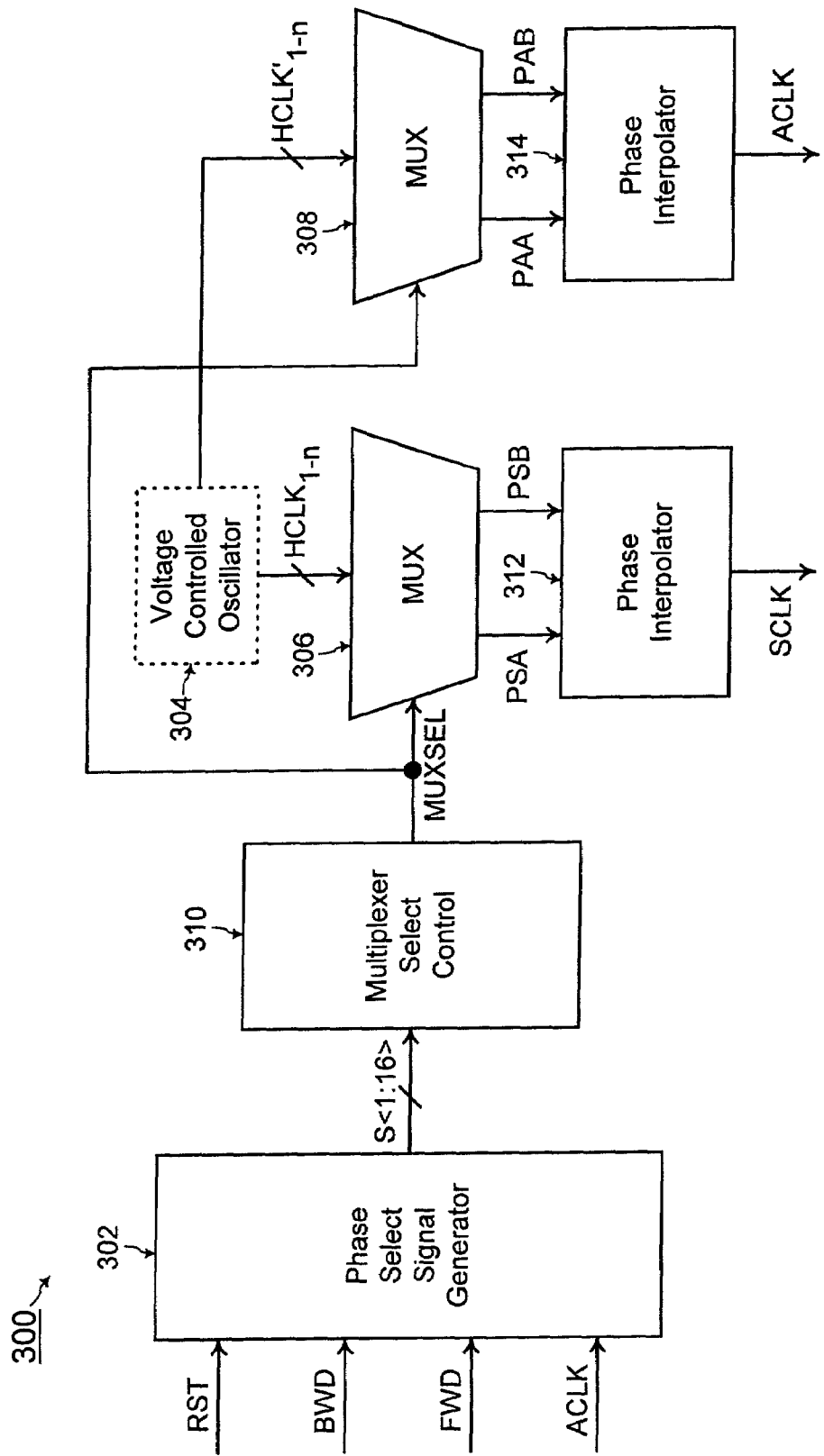
FIG. 11 shows block diagram components of a phase selector for generating the recovered serial clock signals (SCLK and ACLK) with more possible phases than just the phases of given clock signals ($HCLK_{1-n}$) but with a minimized number of phase interpolators, according to another aspect of the present invention.

FIG. 11 shows a block diagram of a phase selector 300 according to another aspect of the present invention. The phase selector 300 includes a phase select signal generator 302 that generates a plurality of phase select signals (S<1: 16>) in response to the FWD signal and the BWD signal from a digital filter (such as the digital filter 204 of FIG. 6 for example). In one embodiment of the present invention, the plurality of phase select signals (S<1:16>) includes sixteen select signals, S1, S2, S3, S4, S5, S6, S7, S8, S9, S10, S11, S12, S13, S14, S15, and S16, generated in that predetermined order.

In addition, a voltage controlled oscillator (VCO) 304 generates a predetermined number of given clock signals $HCLK_{1-n}$ such as the given clock signals $HCLK_{1-8}$ of FIG. 5 for example. Referring to FIGS. 1 and 11, the VCO 304 (shown outlined in dashed lines in FIG. 11) is part of the clock synthesizer phase locked loop 108 and is not part of the phase selector 300. The predetermined number of given clock signals $HCLK_{1-n}$ are arranged in a predetermined phase order. The given clock signals $HCLK_1$, $HCLK_2$, $HCLK_3$, $HCLK_4$, $HCLK_5$, $HCLK_6$, $HCLK_7$, and $HCLK_8$ for example are arranged in the predetermined phase order such that any two adjacent given clock signals have a successive phase difference of 45°. The first clock signal $HCLK_1$ and the last clock signal $HCLK_8$ in that predetermined phase order also have the successive phase difference of 45°. The predetermined number of given clock signals $HCLK_{1-n}$ that are arranged in a predetermined phase order are input to a first multiplexer 306. Voltage controlled oscillators for generating such given clock signals $HCLK_{1-n}$ are known to one of ordinary skill in the art of electronics.

In addition, a predetermined number of complementary given clock signals $HCLK'_{1-n}$ are also generated by the voltage controlled oscillator and input to a second multiplexer 308. The complementary given clock signals $HCLK'_{1-n}$ are also arranged in a second predetermined phase order but each of the complementary given clock signals $HCLK'_{1-n}$ is 180° phase shifted from a respective one of the given clock signals $HCLK_{1-n}$. For example, $HCLK'_1=HCLK_5$ is 180° phase shifted from $HCLK_1$, $HCLK'_2=HCLK_6$ is 180° phase shifted from $HCLK_2$, $HCLK'_3=HCLK_7$ is 180° phase shifted from $HCLK_3$, $HCLK'_4=HCLK_8$ is 180° phase shifted from $HCLK_4$, $HCLK'_5=HCLK_1$ is 180° phase shifted from $HCLK_4$, $HCLK'_6=HCLK_2$ is 180° phase shifted from $HCLK_6$, $HCLK'_7=HCLK_3$ is 180° phase shifted from $HCLK_7$, and $HCLK'_8=HCLK_4$ is 180° phase shifted from $HCLK_8$.

In this manner, the complementary given clock signals $HCLK'_1$, $HCLK'_2$, $HCLK'_3$, $HCLK'_4$, $HCLK'_5$, $HCLK'_6$, $HCLK'_7$, and $HCLK'_8$ are arranged in a predetermined phase order such that any two adjacent complementary given clock signals have a successive phase difference of 45°. In addition, the first complementary given clock signal $HCLK'_1$ and the last complementary clock signal $HCLK'_8$ in that predetermined phase order also have the successive phase difference of 45°. Voltage controlled oscillators for generating such complementary given clock signals $HCLK'_{1-n}$ are known to one of ordinary skill in the art of electronics.

A multiplexer select control 310 controls the first multiplexer 306 to select one of the given clock signals $HCLK_{1-n}$ as a first output clock signal PSA and to select one of the given clock signals $HCLK_{1-n}$ as a second output clock signal PSB, depending on which one of the select signals S<1:16> is asserted. The first and second output clock signals PSA and PSB are input to a first phase interpolator 312 that outputs a recovered serial clock signal (SCLK) that has a phase that is phase interpolated as an average of a first phase of the first output clock signal PSA and a second phase of the second output clock signal PSB.

In addition, the multiplexer select control 310 controls the second multiplexer 308 to select one of the complementary given clock signals $HCLK'_{1-n}$ as a third output clock signal PAA and to select one of the complementary given clock signals $HCLK'_{1-n}$ as a fourth output clock signal PAB, depending on which one of the select signals S<1:16> is asserted. The third and fourth output clock signals PAA and PAB are input to a second phase interpolator 314 that outputs a complementary recovered serial clock signal (ACLK) that has a phase that is phase interpolated as an average of a third phase of the third output clock signal PAA and a fourth phase of the fourth output clock signal PAB.

The third output clock signal PAA is 180° phase shifted from the first output clock signal PSA, and the fourth output clock signal PAB is 180° phase shifted from the second output clock signal PSB. Thus, the complementary recovered serial clock signal (ACLK) output by the second phase interpolator 314 is 180° phase shifted from the recovered serial clock signal (SCLK) output by the first phase interpolator 312.

Figure 12:
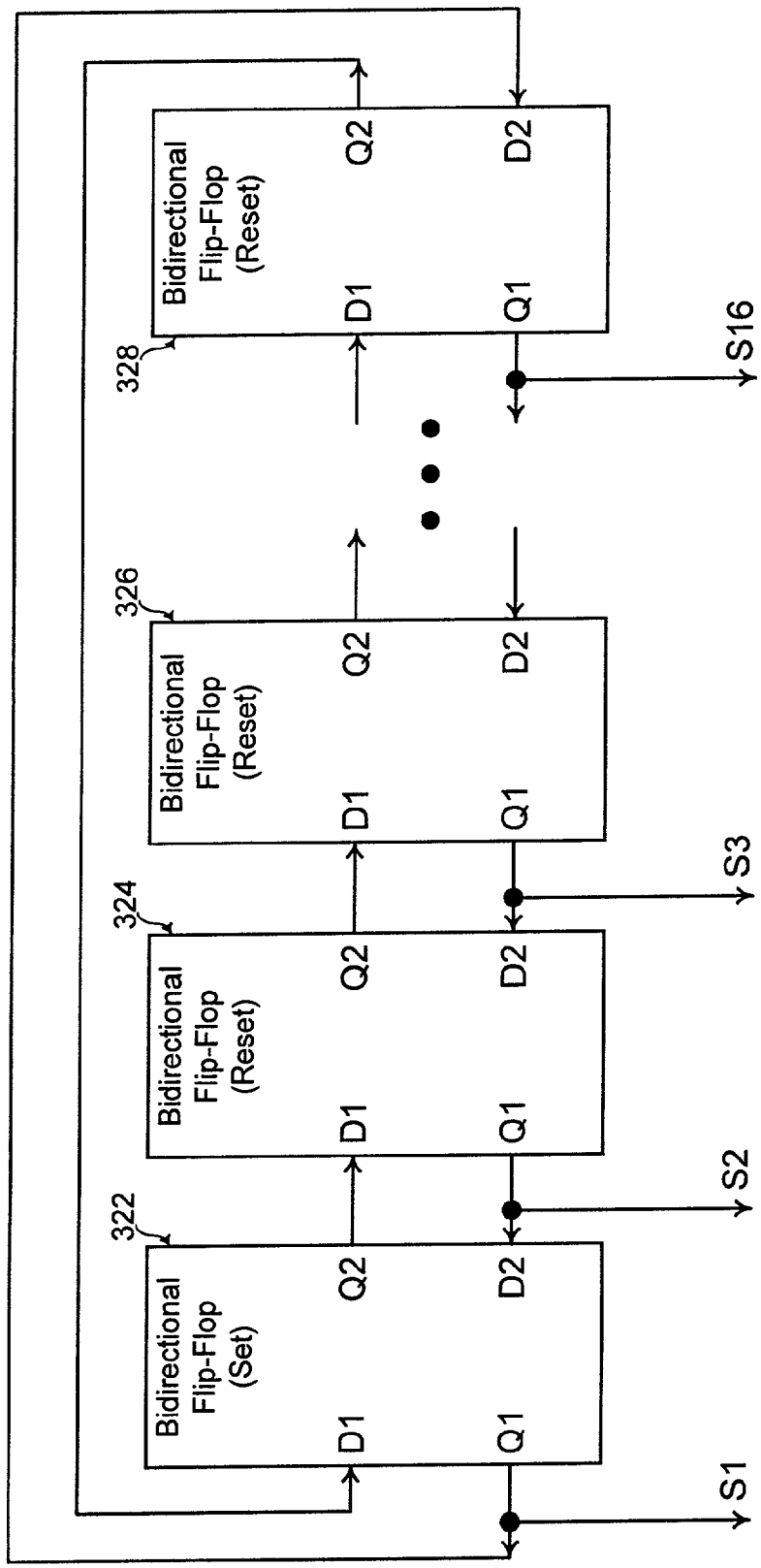
FIG. 12 shows block diagram components of a phase select signal generator comprised of a loop of bidirectional flip-flops for generating a plurality of phase select signals within the phase selector of FIG. 11, according to one embodiment of the present invention.

Referring to FIG. 12, according to one embodiment of the present invention, the phase select signal generator is comprised of a loop of a plurality of bidirectional flip-flops. A respective bidirectional flip-flop generates an output signal as a respective one of the select signals S<1:16>. For example, a first bidirectional flip-flop 322 has a Q1 output that is a first select signal S1 of the select signals S<1:16>, a second bidirectional flip-flop 324 has a Q1 output that is a second select signal S2 of the select signals S<1:16>, a third bidirectional flip-flop 326 has a Q1 output that is a third select signal S3 of the select signals S<1:16>, and so on up to a sixteenth bidirectional flip-flop 328 having a Q1 output that is a sixteenth select signal S16 of the select signals S<1:16>. Thus, sixteen bidirectional flip-flops comprise the phase select signal generator 302 to generate the sixteen select signals S1, S2, S3, S4, S5, S6, S7, S8, S9, S10, S11, S12, S13, S14, S15, and S16 in that predetermined order.

Each bidirectional flip flop of the phase select signal generator 302 inputs the outputs of the two adjacent bidirectional flip flops. In addition, the output of each bidirectional flip flop is coupled as inputs for each of the two adjacent bidirectional flip flops. For example, referring to FIG. 12, the first bidirectional flip flop 322 is priorly adjacent to the second bidirectional flip flop 324, and the third bidirectional flip flop 326 is subsequently adjacent to the second bidirectional flip flop 324.

The output of both adjacent bidirectional flip flops 322 and 326 are input to the second bidirectional flip flop 324. Thus, the Q2 output of the first bidirectional flip flop 322 is a D1 input of the second bidirectional flip flop 324, and the Q1 output of the third bidirectional flip flop 326 is a D2 input of the second bidirectional flip flop 324. In addition, the Q1 output of the second bidirectional flip flop 324 is the D2 input of the first bidirectional flip flop 322, and the Q2 output of the second bidirectional flip flop 324 is the D1 input of the third bidirectional flip flop 326.

The plurality of bidirectional flip flops of the phase select signal generator 302 are coupled in a closed loop with the first bidirectional flip flop 322 being adjacent the sixteenth bidirectional flip flop 328. Thus, the Q2 output of the sixteenth bidirectional flip flop 328 is coupled to the D1 input of the first bidirectional flip flop 322, and the Q1 output of the first bidirectional flip flop 322 is coupled to the D2 input of the sixteenth bidirectional flip flop 328.

Figure 13:
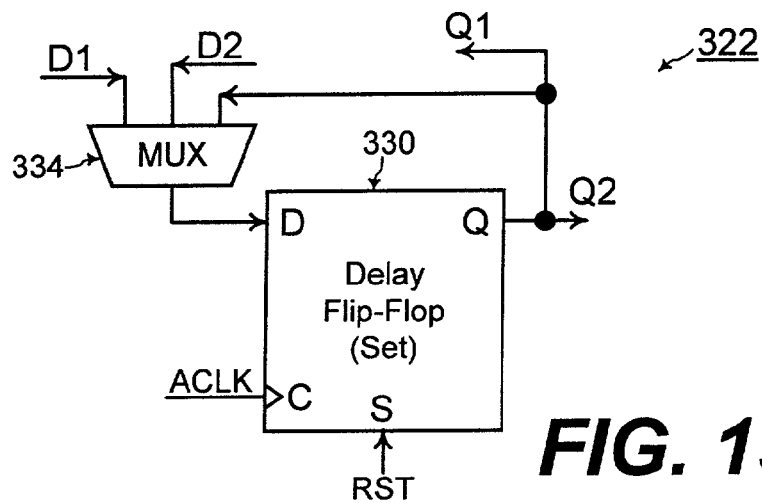
FIG. 13 shows block diagram components of a bidirectional set flip-flop used as a first bidirectional flip-flop in the phase select signal generator of FIG. 12, according to one embodiment of the present invention.
Figure 15:
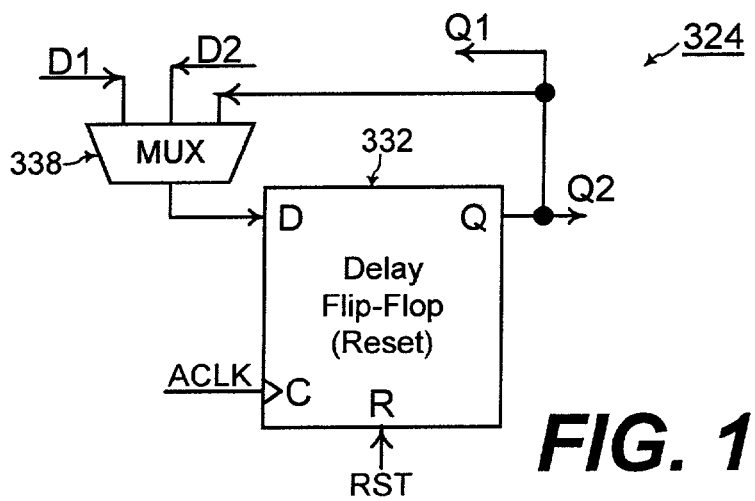
FIG. 15 shows block diagram components of a bidirectional reset flip-flop used as the bidirectional flip-flops after the first bidirectional set flip-flop of FIG. 13 in the phase select signal generator of FIG. 12, according to one embodiment of the present invention.

In addition, the first bidirectional flip flop 322 is a set flip-flop, and the fifteen bidirectional flip flops subsequent to the first bidirectional flip flop 322 in the phase select signal generator 302 are reset flip-flops. FIG. 13 shows a more detailed block diagram of the first bidirectional flip flop 322 comprised of a set delay flip-flop 330. FIG. 15 shows a more detailed block diagram for each of the fifteen bidirectional flip flops, subsequent to the first bidirectional flip flop 322, comprised of a reset delay flip-flop 332.

Referring to FIG. 13, the first bidirectional flip flop 322 is comprised of the set delay flip-flop 330 having the D input coupled to an output of a multiplexer 334. Referring to FIGS. 12 and 13, the multiplexer 334 has a D1 input that is coupled to the Q2 output of the sixteenth bidirectional flip flop 328 and has a D2 input that is coupled to the Q1 output of the second bidirectional flip flop 324. In addition, the multiplexer 334 inputs the Q output of the set delay flip-flop 330. The Q output of the set delay flip-flop 330 is the Q1 and Q2 outputs of the first bidirectional flip flop 322.

Figure 14:
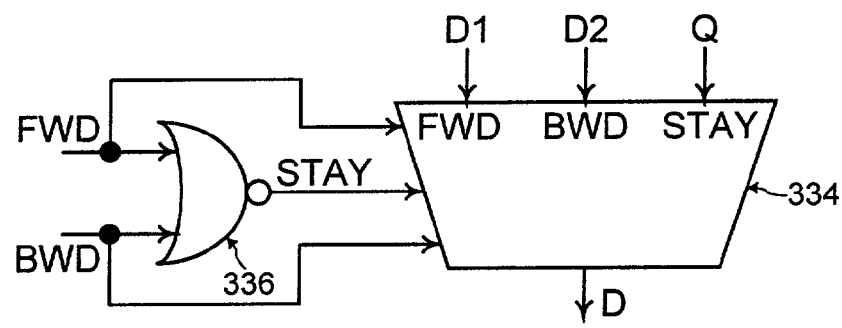
FIG. 14 illustrates the control signals for controlling the output of each of the bidirectional flip-flops within the phase select signal generator of FIG. 12, according to one embodiment of the present invention.

Referring to FIG. 14, the multiplexer 334 selects one of the D1, D2, and Q inputs as the D input to the set delay flip-flop 330 depending on the FWD and BWD signals from a digital filter (such as the digital filter 204 of FIG. 6 for example) of a phase locked loop. The FWD and BWD signals are input to a NOR gate 336 to generate a STAY signal that is asserted to a logical high state "1" if both the FWD signal and BWD signal remain not asserted at the logical low state "0". The multiplexer 334 selects the D1 input as the D input to the set delay flip-flop 330 if the FWD signal is asserted, selects the D2 input as the D input to the set delay flip-flop 330 if the BWD signal is asserted, and selects the Q input as the D input to the set delay flip-flop 330 if the STAY signal from the NOR gate 336 is asserted.

Referring back to FIG. 13, at the next transition of the complementary recovered serial clock signal (ACLK), the D-input from the multiplexer 334 is output as the Q-output of the set delay flip-flop 330. Because the delay flip-flop 330 of FIG. 13 is a set flip flop, the Q-output of the flip-flop 330 is set to a logical high state "1" when the reset signal (RST) is asserted.

Referring to FIG. 15, a multiplexer 338 that operates substantially same as the multiplexer 334 of FIG. 14 determines the D-input of the reset delay flip-flop 332. The D1 input is coupled to the Q2 output of a priorly adjacent bidirectional flip flop, and the D2 input is coupled to the Q1 output of a subsequently adjacent bidirectional flip flop. The Q-output of the reset delay flip-flop 332 is also input to the multiplexer 338. The multiplexer 338 selects the D1 input as the D input to the reset delay flip-flop 332 if the FWD signal is asserted, selects the D2 input as the D input to the reset delay flip-flop 332 if the BWD signal is asserted, and selects the Q input as the D input to the reset delay flip-flop 332 if the STAY signal is asserted when neither the FWD signal nor the BWD signal is asserted. At the next transition of the complementary recovered serial clock signal (ACLK), the D-input from the multiplexer 338 is output as the Q-output of the reset delay flip-flop 332. Because the delay flip-flop 332 of FIG. 15 is a reset flip flop, the Q-output of the flip-flop 332 is reset to a logical low state "0" when the reset signal (RST) is asserted.

Referring to FIGS. 11, 12, 13, 14, and 15, at the beginning of operation of the phase selector 300, the reset (RST) signal is asserted, and the first select signal S1 from the first bidirectional flip-flop 322 is set as the logical high state "1" with the set flip-flop 330 while the rest of the select signals, S2, S3, S4, S5, S6, S7, S8, S9, S10, S11, S12, S13, S14, S15, and S16 are each reset to the logical low state "0"with the respective reset flip-flop 332. This initial set of select signals S1, S2, S3, S4, S5, S6, S7, S8, S9, S10, S11, S12, S13, S14, S15, and S16 results in a set of recovered serial clock signals ACLK and SCLK. Depending on the FWD and BWD signals resulting from such an initial set of the recovered serial clock signals ACLK and SCLK, one of the select signals S1, S2, S3, S4, S5, S6, S7, S8, S9, S10, S11, S12, S13, S14, S15, and S16 is asserted to the logical high state "1" as a currently asserted select signal while the rest of the select signals are not asserted at the logical low state "0".

Referring to FIG. 11, the multiplexer select control 310 controls the first multiplexer 306 to select one of the given clock signals $HCLK_{1-n}$ as the first output clock signal PSA and to select one of the given clock signals $HCLK_{1-n}$ as the second output clock signal PSB, depending on which one of the select signals S<1:16> is asserted, according to the following logical relations:

$PSA=HCLK_1[S1+S2]+HCLK_2[S3+S4]+HCLK_3$
$[S5+S6]+HCLK_4[S7+S8]+HCLK_5[S9+S10]$
$+HCLK_6 [S11+S12]+HCLK_7[S13+S14]+HCLK_8$
$[S15+S16]$; and $PSB=HCLK_1 \quad [S16+S1]+HCLK_2[S2+S3]+HCLK_3$
$[S4+S5]+HCLK_4[S6+S7]+HCLK_5[S8+S9]$
$+HCLK_6 [S10+S11]+HCLK_7[S12+S13]+HCLK_8$
$[S14+S15]$.

Implementation of logic for such multiplexer select control 310 such as by a programmable logic device for example is known to one of ordinary skill in the art of electronics. FIG. 16 shows a table of the respective PSA and PSB clock signals from the first multiplexer 306 when each one of the selected signals S1, S2, S3, S4, S5, S6, S7, S8, S9, S10, S11, S12, S13, S14, S15, and S16 is the currently asserted select signal with the rest of the select signals not being asserted at the logical low state.

Similarly, referring to FIG. 11, the multiplexer select control 310 controls the second multiplexer 308 to select one of the complementary given clock signals $HCLK'_{1-n}$ as the third output clock signal PAA and to select one of the complementary given clock signals $HCLK'_{1-n}$ as the fourth output clock signal PAB, depending on which one of the select signals S<1:16> is asserted, according to the following logical relations:

$PAA=HCLK'_1[S1+S2]+HCLK'_2[S3+S4]+HCLK'_3$
$[S5+S6]+HCLK'_4[S7+S8]+HCLK'_5[S9+S10]$
$+HCLK'_6[S11+S12]+HCLK'_7[S13+S14]$
$+HCLK'_8[S15+S16]$; and $PAB=HCLK'_1[S16+S1]+HCLK'_2[S2+S3]+HCLK'_3$
$[S4+S5]+HCLK'_4[S6+S7]+HCLK'_5[S8+S9]$
$+HCLK'_6[S10+S11]+HCLK'_7[S12+S13]$
$+HCLK'_8[S14+S15]$.

Implementation of logic for such multiplexer select control 310 such as by a programmable logic device for example is known to one of ordinary skill in the art of electronics. FIG. 17 shows a table of the respective PAA and PAB clock signals from the second multiplexer 308 when each one of the selected signals S1, S2, S3, S4, S5, S6, S7, S8, S9, S10, S11, S12, S13, S14, S15, and S16 is the currently asserted select signal with the rest of the select signals not being asserted at the logical low state.

Referring to FIGS. 11 and 16, the first phase interpolator 312 inputs the first output clock signal PSA and the second output clock signal PSB from the first multiplexer 306. The first phase interpolator 312 generates the recovered serial clock signal (SCLK) having a phase that is phase interpolated as an average of the first phase of the first output clock signal PSA and the second phase of the second output clock signal PSB. Implementation of such phase interpolators are known to one of ordinary skill in the art of electronics. FIG. 16 shows the phase of the recovered serial clock signal (SCLK) generated by the first phase interpolator 312 for each possible set of the first output clock signal PSA and the second output clock signal PSB from the first multiplexer 306.

Referring to FIG. 16, the recovered serial clock signal (SCLK) is a chosen clock signal that is one of the given clock signals $HCLK_{1-n}$ when the first output clock signal PSA and the second output clock signal PSB are that chosen clock signal. In FIG. 16, the recovered serial clock signal (SCLK) is $HCLK_1$ as the chosen clock signal when the first output clock signal PSA and the second output clock signal PSB are both $HCLK_1$ when the first select signal S1 is asserted. The recovered serial clock signal (SCLK) is $HCLK_2$ as the chosen clock signal when the first output clock signal PSA and the second output clock signal PSB are both $HCLK_2$ when the third select signal S3 is asserted. The recovered serial clock signal (SCLK) is $HCLK_3$ as the chosen clock signal when the first output clock signal PSA and the second output clock signal PSB are both $HCLK_3$ when the fifth select signal S5 is asserted. The recovered serial clock signal (SCLK) is $HCLK_4$ as the chosen clock signal when the first output clock signal PSA and the second output clock signal PSB are both $HCLK_4$ when the seventh select signal S7 is asserted.

Similarly, the recovered serial clock signal (SCLK) is $HCLK_5$ as the chosen clock signal when the first output clock signal PSA and the second output clock signal PSB are both $HCLK_5$ when the ninth select signal S9 is asserted. The recovered serial clock signal (SCLK) is $HCLK_6$ as the chosen clock signal when the first output clock signal PSA and the second output clock signal PSB are both $HCLK_6$ when the eleventh select signal S11 is asserted. The recovered serial clock signal (SCLK) is $HCLK_7$ as the chosen clock signal when the first output clock signal PSA and the second output clock signal PSB are both $HCLK_7$ when the thirteenth select signal S13 is asserted. The recovered serial clock signal (SCLK) is $HCLK_8$ as the chosen clock signal when the first output clock signal PSA and the second output clock signal PSB are both $HCLK_8$ when the fifteenth select signal S15 is asserted.

Alternatively, further referring to FIG. 16, the recovered serial clock signal (SCLK) is one of a leading interpolated clock signal or a lagging interpolated clock signal of a chosen clock signal of the given clock signals $HCLK_{1-n}$. When the recovered serial clock signal (SCLK) is the leading interpolated clock signal of the chosen clock signal, the phase of the recovered serial clock signal (SCLK) is phase interpolated as an average of the phase of the chosen clock signal and the phase of an adjacent leading clock signal in the phase order of the given clock signal $HCLK_{1-n}$. For example, assume that the recovered serial clock signal (SCLK) is the leading interpolated clock signal of the second given clock signal $HCLK_2$ as the chosen clock signal. In that case, the phase of the recovered serial clock signal (SCLK) is phase interpolated as an average of the phase of the second given clock signal $HCLK_2$ and the phase of the third given clock signal $HCLK_3$ which is the adjacent leading clock signal of the second given clock signal $HCLK_2$.

On the other hand, when the recovered serial clock signal (SCLK) is the lagging interpolated clock signal of the chosen clock signal, the phase of the recovered serial clock signal (SCLK) is phase interpolated as an average of the phase of the chosen clock signal and the phase of an adjacent lagging clock signal in the phase order of the given clock signals $HCLK_{1-n}$. For example, assume that the recovered serial clock signal (SCLK) is the lagging interpolated clock signal of the second given clock signal $HCLK_2$ as the chosen clock signal. In that case, the phase of the recovered serial clock signal (SCLK) is phase interpolated as an average of the phase of the second given clock signal $HCLK_2$ and the phase of the first given clock signal $HCLK_1$ which is the adjacent lagging clock signal of the second given clock signal $HCLK_2$.

In this manner, referring to FIG. 16, sixteen phases are possible for the recovered serial clock signal (SCLK) with the one first phase interpolator 312 from the eight given clock signals $HCLK_{1-n}$. The sixteen possible phases have a successive phase difference of 22.5°. The phase of the recovered serial clock signal (SCLK) depends on which one of the selected signals S1, S2, S3, S4, S5, S6, S7, S8, S9, S10, S11, S12, S13, S14, S15, and S16 is the currently asserted select signal at the logical high state with the rest of the select signals not being asserted at the logical low state.

Referring to FIGS. 12, 13, 14, and 15, a prior adjacent one from the currently asserted phase select signal in the order of phase select signals S1, S2, S3, S4, S5, S6, S7, S8, S9, S10, S11, S12, S13, S14, S15, and S16 is asserted as a newly asserted phase select signal when the BWD signal is asserted. Alternatively, a subsequently adjacent one from the currently asserted phase select signal in the order of phase select signals S1, S2, S3, S4, S5, S6, S7, S8, S9, S10, S11, S12, S13, S14, S15, and S16 is asserted as the newly asserted phase select signal when the FWD signal is asserted. Alternatively, the currently asserted phase select signal remains as the newly asserted phase select signal if neither the FWD signal nor the BWD signal is asserted.

In this manner, when a current recovered serial clock signal (SCLK) is a chosen clock signal and when a FWD signal is asserted, the chosen clock signal and the adjacent leading clock signal of the chosen clock signal are selected as the first output clock signal PSA and the second output clock signal PSB. Thus, a newly recovered serial clock signal (SCLK) generated by the first phase interpolator 312 is the leading interpolated clock signal of the chosen clock signal.

For example, assume that the current recovered serial clock signal (SCLK) is the second given clock signal $HCLK_2$ as the chosen clock signal with the third select signal S3 currently being asserted. When the FWD signal is then asserted, the fourth select signal S4 becomes the newly asserted select signal with the third select signal S3 being not asserted at the logical low state. In that case, the second given clock signal $HCLK_2$ as the chosen clock signal and the third given clock signal $HCLK_3$ as the adjacent leading clock signal are selected as the first output clock signal PSA and the second output clock signal PSB. Thus, the newly recovered serial clock signal (SCLK) is the leading interpolated clock signal of the second given clock signal $HCLK_2$ having a phase that is phase interpolated as an average of the phase of the second given clock signal $HCLK_2$ as the chosen clock signal and the phase of the third given clock signal $HCLK_3$ as the adjacent leading clock signal.

Alternatively, when a current recovered serial clock signal (SCLK) is a chosen clock signal and when a BWD signal is asserted, the chosen clock signal and the adjacent lagging clock signal of the chosen clock signal are selected as the first output clock signal PSA and the second output clock signal PSB. Thus, the newly recovered serial clock signal (SCLK) generated by the first phase interpolator 312 is the lagging interpolated clock signal of the chosen clock signal.

For example, assume that the current recovered serial clock signal (SCLK) is the second given clock signal $HCLK_2$ as the chosen clock signal with the third select signal S3 currently being asserted. When the BWD signal is then asserted, the second select signal S2 becomes the newly asserted select signal with the third select signal S3 being not asserted at the logical low state. In that case, the second given clock signal $HCLK_2$ as the chosen clock signal and the first given clock signal $HCLK_1$ as the adjacent lagging clock signal are selected as the first output clock signal PSA and the second output clock signal PSB. Thus, the newly recovered serial clock signal (SCLK) is the lagging interpolated clock signal of the second given clock signal $HCLK_2$ having a phase that is phase interpolated as an average of the phase of the second given clock signal $HCLK_2$ as the chosen clock signal and the phase of the first given clock signal $HCLK_1$ as the adjacent lagging clock signal.

Furthermore, when a current recovered serial clock signal (SCLK) is one of a leading or lagging interpolated clock signal and when the FWD signal is asserted, an immediately leading one of the given clock signals $HCLK_{1-n}$ having a phase that leads the current recovered serial clock signal (SCLK) by a least phase amount is selected as the first output clock signal PSA and the second output clock signal PSB. Thus, the newly recovered serial clock signal (SCLK) generated by the first phase interpolator 312 is the immediately leading one of the given clock signals $HCLK_{1-n}$ having a phase that leads the current recovered serial clock signal (SCLK) by a least phase amount.

For example, assume that the current recovered serial clock signal (SCLK) is the phase interpolated clock signal having a phase that is the average of the phase of the second given clock signal $HCLK_2$ and the phase of the third given clock signal $HCLK_3$ with the fourth select signal S4 currently being asserted. When the FWD signal is then asserted, the fifth select signal S5 becomes the newly asserted select signal with the fourth select signal S4 being not asserted at the logical low state. In that case, the third given clock signal $HCLK_3$ is the immediately leading one of the given clock signals $HCLK_{1-n}$ having a phase that leads the current recovered serial clock signal (SCLK) by a least phase amount and is selected as the first output clock signal PSA and the second output clock signal PSB. Thus, the newly recovered serial clock signal (SCLK) is the third given clock signal $HCLK_3$ that is the immediately leading one of the given clock signals $HCLK_{1-n}$ having a phase that leads the current recovered serial clock signal (SCLK) by a least phase amount.

On the other hand, when a current recovered serial clock signal (SCLK) is one of a leading or lagging interpolated clock signal and when the BWD signal is asserted, an immediately lagging one of the given clock signals $HCLK_{1-n}$ having a phase that lags the current recovered serial clock signal (SCLK) by a least phase amount is selected as the first output clock signal PSA and the second output clock signal PSB. Thus, the newly recovered serial clock signal (SCLK) generated by the first phase interpolator 312 is the immediately lagging one of the given clock signals $HCLK_{1-n}$ having a phase that lags the current recovered serial clock signal (SCLK) by a least phase amount.

For example, assume that the current recovered serial clock signal (SCLK) is the phase interpolated clock signal having a phase that is the average of the phase of the second given clock signal $HCLK_2$ and the phase of the third given clock signal $HCLK_3$ with the fourth select signal S4 currently being asserted. When the BWD signal is then asserted, the third select signal S3 becomes the newly asserted select signal with the fourth select signal S4 being not asserted at the logical low state. In that case, the second given clock signal $HCLK_2$ is the immediately lagging one of the given clock signals $HCLK_{1-n}$ having a phase that lags the current recovered serial clock signal (SCLK) by a least phase amount and is selected as the first output clock signal PSA and the second output clock signal PSB. Thus, the newly recovered serial clock signal (SCLK) is the second given clock signal $HCLK_2$ that is the immediately lagging one of the given clock signals $HCLK_{1-n}$ having a phase that lags the current recovered serial clock signal (SCLK) by a least phase amount.

In this manner, the phase of the recovered serial clock signal (SCLK) is adjusted to increase by a phase shift of 22.5° whenever the FWD signal is asserted, and to decrease by a phase shift of 22.5° whenever the BWD signal is asserted. The phase of the recovered serial clock signal (SCLK) is thus adjusted until neither the FWD signal nor the BWD signal is asserted. When neither the FWD signal nor the BWD signal is asserted, the currently asserted phase select signal remains as the newly asserted phase select signal, and the newly recovered serial clock signal (SCLK) remains unchanged as the current recovered serial clock signal (SCLK).

Similarly, the complementary recovered serial clock signal (ACLK) is generated by the second phase interpolator 314 from the third output clock signal PAA and the fourth output clock signal PAB according to the table of FIG. 17. The complementary recovered serial clock signal (ACLK) is 180° phase shifted from the recovered serial clock signal (SCLK) since the third output clock signal PAA is 180° phase shifted from the first output clock signal PSA and since the fourth output clock signal PAB is 180° phase shifted from the second output clock signal PSB.

With such a phase selector 300 of this aspect of the present invention, the recovered serial clock signal (SCLK) having sixteen possible phases is generated from the eight given clock signals $HCLK_{1-n}$ using only one phase interpolator 312. Another phase interpolator 314 is used to generate the complementary recovered serial clock signal (ACLK) having sixteen possible phases from the eight complementary given clock signals $HCLK'_{1-n}$. Such a minimized number of phase interpolators for generating the recovered serial clock signal (SCLK) is advantageous for consuming minimized power and chip space by the phase selector 300 of the present invention.

In addition, because the phase select signal generator 302 is a closed loop of bidirectional flip-flops with the first bidirectional flip-flop 322 being coupled to the last sixteenth bidirectional flip-flop 328, the select signals S1, S2, S3, S4, S5, S6, S7, S8, S9, S10, S11, S12, S13, S14, S15, and S16 are properly generated with any drift of the phase of the high speed serial data input (SDIN). If the bidirectional flip-flops of the phase select signal generator 302 were not coupled in a closed loop, then the select signals S1, S2, S3, S4, S5, S6, S7, S8, S9, S10, S11, S12, S13, S14, S15, and S16 may be stuck with just the first select signal S1 being repeatedly asserted as the phase of the high speed serial data input (SDIN) drifts toward the lagging direction. Or, if the bidirectional flip-flops of the phase select signal generator 302 were not coupled in a closed loop, then the select signals S1, S2, S3, S4, S5, S6, S7, S8, S9, S10, S11, S12, S13, S14, S15, and S16 may be stuck with just the last sixteenth select signal S16 being repeatedly asserted as the phase of the high speed serial data input (SDIN) drifts toward the leading direction.

It will be understood by those of skill in the art that the foregoing description is only exemplary of the invention and is not intended to limit its application to the structure and operation described herein. Many of the components can be implemented in hardware or software and in discrete or integrated circuits. Furthermore, the phase selector using one phase interpolator of the present invention may be used for any number of given clock signals for doubling the possible number of phases. In addition, the present invention may be practiced with the phase interpolator generating any phase (aside from just the example of an average) that is phase interpolated between the phases of the two clock signals that are input to the phase interpolator, as would be apparent to one of ordinary skill in the art of SERDES transceivers from the description herein.

Figure 18:
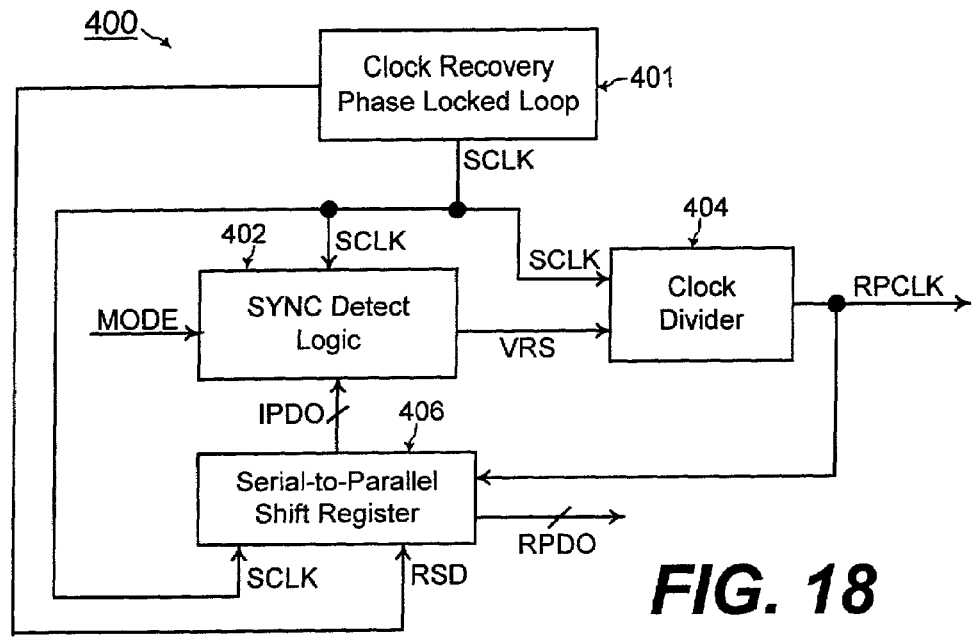
FIG. 18 shows block diagram components of a clock data recovery deserializer having a SYNC detect logic with a plurality of programmable synchronization bit patterns for ensuring proper partitioning of the high speed serial data input (SDIN) to generate the v-bits wide recovered parallel data output (RPDO) for multiple communications protocols, according to another aspect of the present invention.

Referring to FIG. 18, in another aspect of the present invention, a CDR (clock data recovery) deserializer 400 includes a clock recovery phase locked loop 401, a SYNC (synchronization) detect logic 402, a clock divider 404, and a serial-to-parallel shift register 406. In one embodiment of the present invention, the clock recovery phase locked loop 401 is implemented as the clock recovery phase locked loop 200 of FIG. 6. The clock divider 404 receives from the phase locked loop 401 the recovered clock signal (SCLK) having a first relatively high frequency such as 1.25 GHz (gigahertz) for example and generates a divided clock signal (i.e., the recovered parallel clock signal, RPCLK) having a second frequency. The second frequency of the divided clock signal RPCLK is lowered from the first frequency of the recovered clock signal (SCLK) by a predetermined ratio number "v". Thus, each cycle of the divided clock signal RPCLK is generated for each count of cycles of the recovered clock signal (SCLK) up to the predetermined ratio number "v". Implementation of such a clock divider is known to one of ordinary skill in the art of electronics.

The serial-to-parallel shift register 406 shifts in bits of the recovered serial data (RSD) recovered from the clock recovery phase locked loop 401 with each cycle of the recovered clock signal (SCLK). The recovered serial data (RSD) is the high speed serial data input (SDIN) sampled at every cycle of the recovered serial clock signal (SCLK) and is ideally substantially same as the high speed serial data input (SDIN). Mechanisms within the clock recovery phase locked loop 401 such as within the phase transition detector 202 of FIG. 6 for example for sampling a data signal with a clock signal to generate the recovered serial data (RSD) are known to one of ordinary skill in the art. The serial-to-parallel shift register 406 outputs the predetermined ratio "v" number of bits of the shifted recovered serial data (RSD) as the recovered parallel data output (RPDO) at a predetermined transition of every cycle of the divided clock signal (RPCLK). For example, the predetermined ratio "v" number of bits of the recovered parallel data output (RPDO) is output by the serial-to-parallel shift register 406 at each low-to-high transition of every cycle of the divided clock signal (RPCLK). Implementation of serial-to-parallel shift registers are known to one of ordinary skill in the art of electronics.

Figure 3:
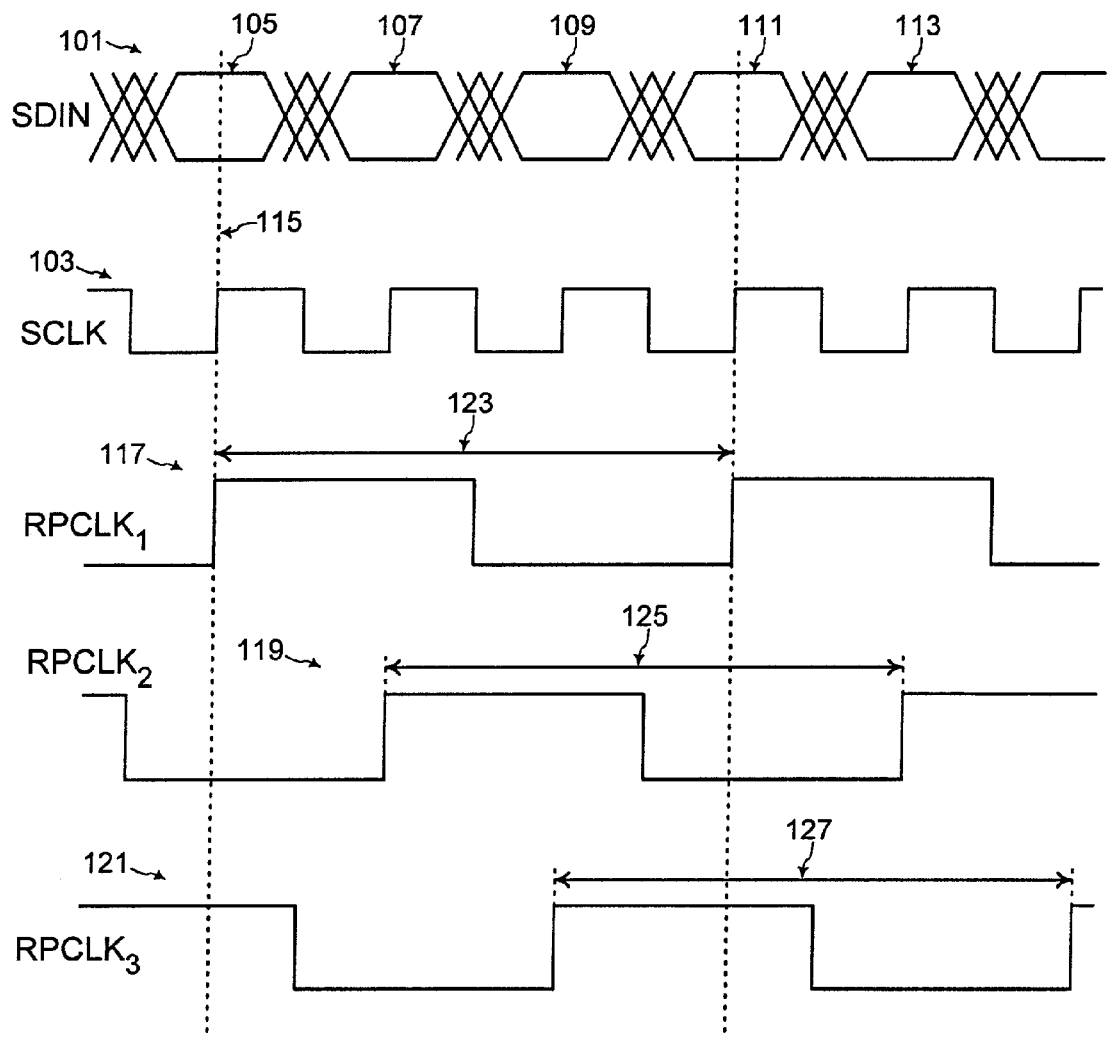
FIG. 3 shows an example timing diagram illustrating possible first, second, and third recovered parallel clock signals ($RPCLK_1$, $RPCLK_2$, and $RPCLK_3$) from a clock divider of the clock data recovery deserializer of FIG. 2, according to the prior art.

Referring to FIG. 3, when the predetermined ratio "v" number of bits of the recovered parallel data output (RPDO) is three bits wide for example, the low-to-high transition of the divided clock signal (RPCLK) may occur at any of three time points for a group of three bits of data. Depending on the time point of the low-to-high transition of the divided clock signal (RPCLK), the three bits of the recovered parallel data output (RPDO) is partitioned at different boundaries of three bits of the high speed serial data input (SDIN). The SYNC detect logic 402 according to an embodiment of the present invention asserts a VRS (diVider ReSet) signal (i.e., a parallel clock enabling signal) to control the occurrence of the time point of the predetermined low-to-high transition of the divided clock signal (RPCLK) at the desired one of the three possible time points such that the three bits of the recovered parallel data output (RPDO)

is partitioned at the proper boundaries of three bits of the high speed serial data input (SDIN).

Figure 19:
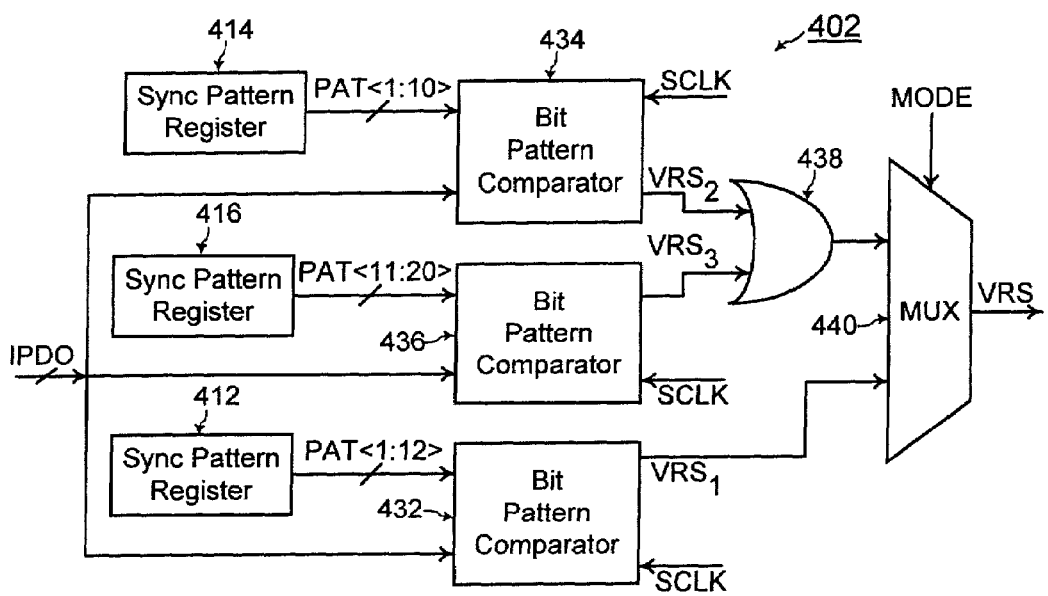
FIG. 19 shows block diagram components of the SYNC detect logic, of the clock data recovery deserializer of FIG. 18, having a multiplexer disposed after a plurality of bit pattern comparators, according to one embodiment of the present invention.

Referring to FIG. 19, the SYNC detect logic 402 according to an embodiment of the present invention includes a plurality of reloadable register portions including a first reloadable register portion 412, a second reloadable register portion 414, and a third reloadable register portion 416. A respective bit pattern of a respective predetermined number of data bits for a respective communications protocol is stored in each of the first, second, and third reloadable register portions 412, 414, and 416. A first synchronization bit pattern comprised of twelve bits PAT<1:12> for a first communications protocol for example is stored within the first reloadable register portion 412. A second synchronization bit pattern comprised often bits PAT<1:10> for a second communications protocol for example is stored within the second reloadable register portion 414. A third synchronization bit pattern comprised of another ten bits PAT<11:20> for the second communications protocol for example is stored within the third reloadable register portion 416.

Each of the first, second, and third synchronization bit patterns corresponds to a respective communications protocol. For example, the first synchronization bit pattern comprised of twelve bits PAT<1:12> may be for the "10B/12B" Serial Data Protocol as known to one of ordinary skill in the art of SERDES transceivers. Such twelve bits typically are comprised of a successive number of logical high "1" data bits and a successive number of logical low "0" data bits such as "1 1 1 1 1 1 0 0 0 0 0 0" or "1 1 1 0 0 0 1 1 1 0 0 0" for example. The second and third synchronization bit patterns comprised of ten bits each may be for the "8B/10B" Fibre Channel Serial Data Protocol as known to one of ordinary skill in the art of SERDES transceivers. For example, the second synchronization bit pattern may be a +K28.5 bit pattern "1 1 0 0 0 0 0 1 0 1", and the third synchronization bit pattern may be a −K28.5 bit pattern "0 0 1 1 1 1 1 0 1 0" for example. However, such synchronization bit patterns for such communications protocols are by way of example only. Thus, the present invention may be practiced for any synchronization bit pattern for the first, second, and third synchronization bit patterns stored within the first, second, and third reloadable register portions 412, 414, and 416 for any communications protocol.

Figure 20:
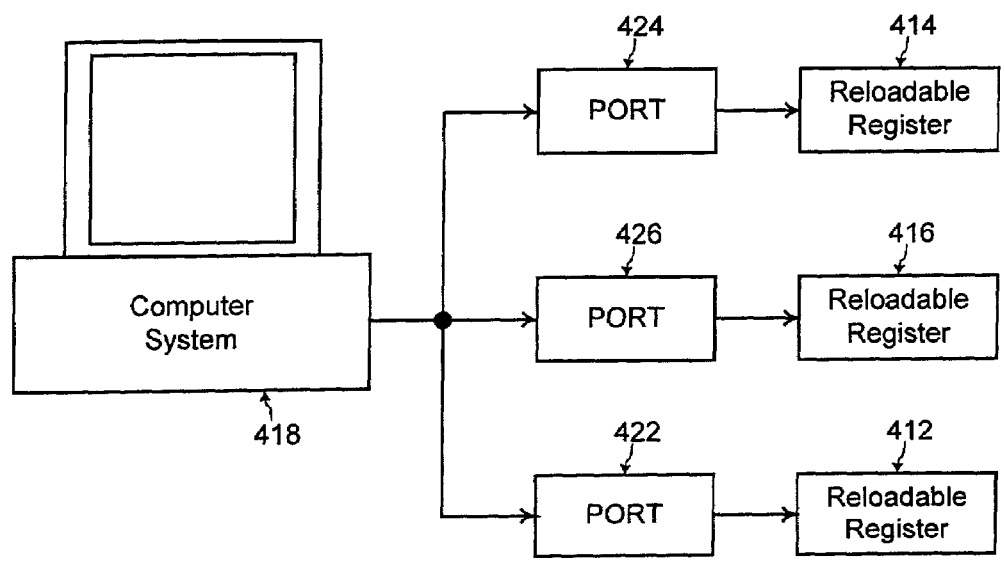
FIG. 20 shows further block diagram components for the SYNC detect logic of FIG. 19 for programming the plurality of synchronization bit patterns into a plurality of reloadable registers for multiple communications protocols by software from a computer system, according to one embodiment of the present invention.

Referring to FIG. 20, the first, second, and third synchronization bit patterns are programmed into the first, second, and third reloadable register portions 412, 414, and 416, respectively, with software from a computer system 418. The first reloadable register portion 412 is capable of being coupled to a first port 422 for receiving and storing the first synchronization bit pattern programmed by the computer system 418 through the first port 422. The second reloadable register portion 414 is capable of being coupled to a second port 424 for receiving and storing the second synchronization bit pattern programmed by the computer system 418 through the second port 424. The third reloadable register portion 416 is capable of being coupled to a third port 426 for receiving and storing the third synchronization bit pattern programmed by the computer system 418 through the third port 426.

Figure 21:
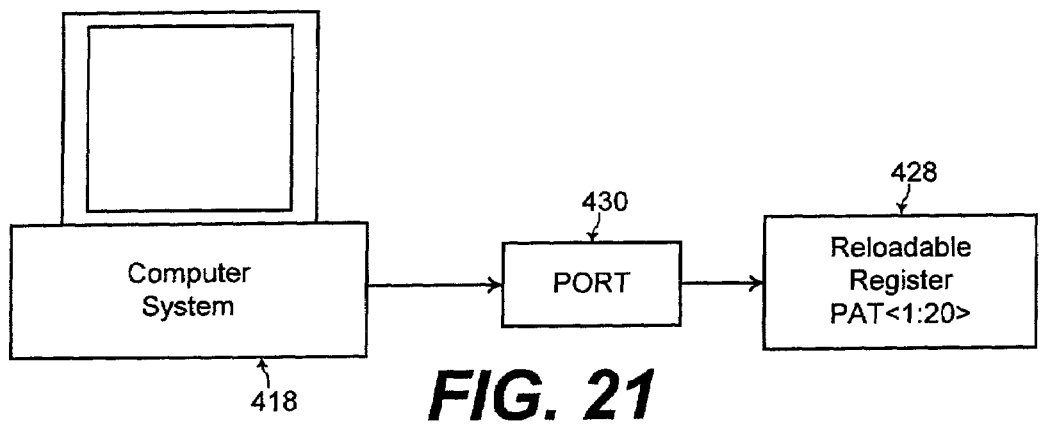
FIG. 21 shows further block diagram components for the SYNC detect logic of FIG. 19 for programming the plurality of synchronization bit patterns into one reloadable register for multiple communications protocols by software from a computer system, according to another embodiment of the present invention.

In the example of FIG. 20, each of the first, second, and third reloadable register portions 412, 414, and 416 are each part of a separate respective reloadable register coupled to a separate respective one of the first, second, and third ports 422, 424, and 426. In contrast, referring to FIG. 21, the first, second, and third reloadable register portions 412, 414, and 416 are each part of a same one reloadable register 428. For example, the reloadable register 428 may be comprised of twenty data bits PAT<1:20> with each of the first, second, and third synchronization bit patterns being programmed into a respective portion of the one reloadable register 428.

For example, the first synchronization bit pattern is programmed through a port 430 as the first twelve bits PAT<1:12> of the one reloadable register 428 when the high speed serial data input (SDIN) is for the "10B/12B" Serial Data Protocol. Or, when the high speed serial data input (SDIN) is for the "8B/10B" Fibre Channel Serial Data Protocol, the second synchronization bit pattern is programmed through the port 430 as the first ten bits PAT<1:10> of the one reloadable register 428, and the third synchronization bit pattern is programmed through the port 430 as the last ten bits PAT<11:20> of the one reloadable register 428.

The reloadable registers 412, 414, 416, and 428 may be any type of programmable data storage device as known to one of ordinary skill in the art of electronics. The present invention may be practiced when the reloadable registers 412, 414, and 416 each are part of a respective separate data storage device or each are integral portions of a same data storage device, as would be apparent to one of ordinary skill in the art of electronics from the description herein. Computer systems and programming values into data storage devices with computer systems through ports are known to one of ordinary skill in the art of electronics. An example of such software for programming the first, second, and third synchronization bit patterns into the first, second, and third reloadable registers 412, 414, and 416, respectively, or into the one reloadable register 428, from the computer system 418 is the "ispDOWNLOAD" software application commercially known and available to one of ordinary skill in the art of electronics from Lattice Semiconductor Corp. headquartered in Hillsboro, Oreg.

Referring back to FIG. 19, a first bit pattern comparator 432 inputs an intermediate parallel data output (IPDO) from the serial-to-parallel shift register 406 with each cycle of the recovered clock signal (SCLK). The IPDO is the v-bits of the recovered serial data (RSD) shifted into the shift register 406 with each bit of the recovered serial data (RSD) being shifted at each cycle of the recovered clock signal (SCLK). In addition, the first bit pattern comparator 432 compares for every cycle of the recovered clock signal (SCLK) the predetermined number of bits of the first synchronization bit pattern stored within the first reloadable register portion 412 to a same predetermined number of bits of the intermediate parallel data output (IPDO) from the shift register 406. The first bit pattern comparator 432 asserts a first comparator output signal ($VRS_1$) when the first synchronization bit pattern stored within the first reloadable register portion 412 is substantially same as a predetermined number of bits of the intermediate parallel data output (IPDO) from the shift register 406. Implementation of such a bit pattern comparator is known to one of ordinary skill in the art of electronics.

In addition, a second bit pattern comparator 434 inputs the intermediate parallel data output (IPDO) from the serial-to-parallel shift register 406 with each cycle of the recovered clock signal (SCLK). The second bit pattern comparator 434 compares for every cycle of the recovered clock signal (SCLK) the predetermined number of bits of the second synchronization bit pattern stored within the second reloadable register portion 414 to a same predetermined number of bits of the intermediate parallel data output (IPDO) from the shift register 406. The second bit pattern comparator 434 asserts a second comparator output signal ($VRS_2$) when the second synchronization bit pattern stored within the second reloadable register portion 414 is substantially same as a predetermined number of bits of the intermediate parallel data output (IPDO) from the shift register 406. Implementation of such a bit pattern comparator is known to one of ordinary skill in the art of electronics.

Furthermore, a third bit pattern comparator 436 inputs the intermediate parallel data output (IPDO) from the serial-to-parallel shift register 406 with each cycle of the recovered clock signal (SCLK). The third bit pattern comparator 436 compares for every cycle of the recovered clock signal (SCLK) the predetermined number of bits of the third synchronization bit pattern stored within the third reloadable register portion 416 to a same predetermined number of bits of the intermediate parallel data output (IPDO) from the shift register 406. The third bit pattern comparator 436 asserts a third comparator output signal (VRS$_3$) when the third synchronization bit pattern stored within the third reloadable register portion 416 is substantially same as a predetermined number of bits of the intermediate parallel data output (IPDO) from the shift register 406. Implementation of such a bit pattern comparator is known to one of ordinary skill in the art of electronics.

The second comparator output signal (VRS$_2$) and the third comparator output signal (VRS$_3$) are input to an OR-gate 438, and the output of the OR-gate 438 is input to a multiplexer 440. The first comparator output signal (VRS$_1$) is also input to the multiplexer 440. The output of the multiplexer 440 is determined by the MODE signal which indicates the communications protocol of the recovered serial data (RSD). When the MODE signal indicates that the recovered serial data (RSD) is for the first communications protocol of the first synchronization bit pattern stored within the first reloadable register portion 412, the first comparator output signal (VRS$_1$) is gated as the output of the multiplexer 440 as the VRS signal (i.e., the parallel clock enabling signal). When the MODE signal indicates that the recovered serial data (RSD) is for the second communications protocol of the second and third synchronization bit patterns stored within the second and third reloadable register portions 414 and 416, the output of the OR-gate 438 is gated as the output of the multiplexer 440 as the VRS signal (i.e., the parallel clock enabling signal).

Referring to FIGS. 18 and 19, the VRS signal is input by the clock divider 404, and the time point when the VRS signal is asserted determines the predetermined transition of the recovered parallel clock signal (RPCLK) that determines the proper partitioning of the recovered serial data (RSD) to form the recovered parallel data output (RPDO). In this manner, the VRS signal is asserted differently depending on the communications protocol of the high speed serial data input (SDIN) to properly partition the recovered serial data (RSD) to form the recovered parallel data output (RPDO). Thus, the CDR (clock data recovery) deserializer 400 accommodates multiple communications protocols of the high speed serial data input (SDIN) for proper partitioning of the recovered serial data (RSD) to form the recovered parallel data output (RPDO).

Figure 22:
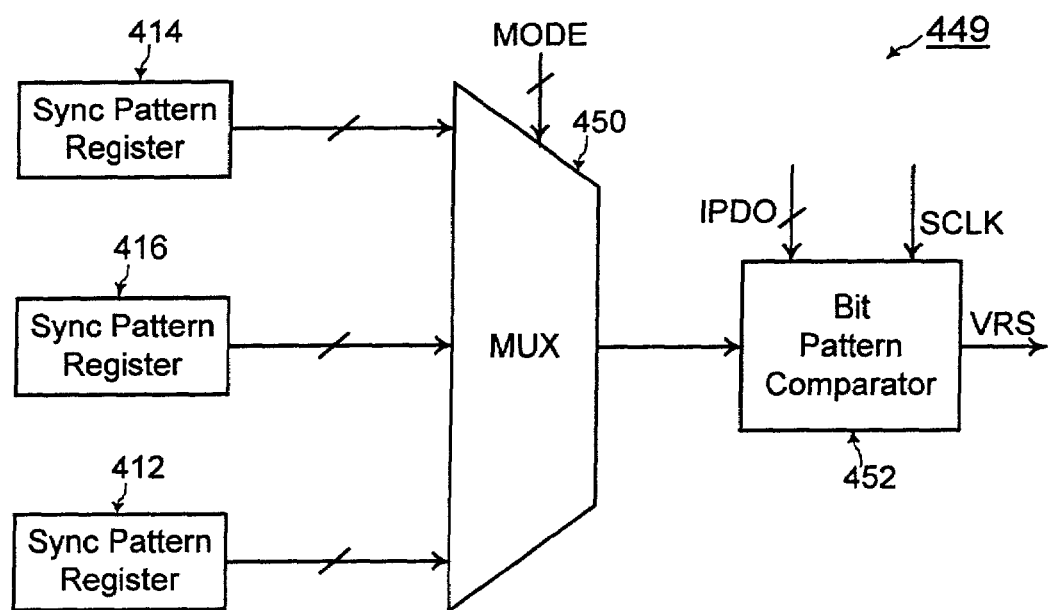
FIG. 22 shows block diagram components of the SYNC detect logic, of the clock data recovery deserializer of FIG. 18, having a multiplexer disposed after a plurality of registers and disposed before a bit pattern comparator, according to another embodiment of the present invention.

Referring to FIG. 22, in another embodiment of the SYNC detect logic 449, a multiplexer 450 is disposed after the first, second, and third reloable registers 412, 414, and 416 and before a bit pattern comparator 452. In this embodiment, the multiplexer 450 selects one of the first, second, and third synchronization bit patterns from the first, second, and third reloable registers 412, 414, and 416 depending on the communications protocol as indicated by the MODE signal. The selected synchronization bit pattern from the multiplexer 450 is input by the bit pattern comparator 452.

The bit pattern comparator 452 inputs the intermediate parallel data output (IPDO) from the serial-to-parallel shift register 406 with each cycle of the recovered clock signal (SCLK). The bit pattern comparator 452 compares for every cycle of the recovered clock signal (SCLK) the predetermined number of bits of the selected synchronization bit pattern to a same predetermined number of bits of the intermediate parallel data output (IPDO) from the shift register 406. The bit pattern comparator 452 asserts the VRS signal when the selected synchronization bit pattern from the multiplexer 450 is substantially same as a predetermined number of bits of the intermediate parallel data output (IPDO) from the shift register 406. Implementation for the multiplexer 450 and the bit pattern comparator 452 is known to one of ordinary skill in the art of electronics.

It will be understood by those of skill in the art that the foregoing description is only exemplary of the invention and is not intended to limit its application to the structure and operation described herein. Many of the components can be implemented in hardware or software and in discrete or integrated circuits. Furthermore, the SYNC detect logic 402 of FIG. 19 may be comprised of any number of reloadable register portions and corresponding bit pattern comparators for accommodating any number of communications protocols of the high speed serial data input (SDIN).

Additionally, the present invention may be practiced when the reloadable register portions 412, 414, and 416 are any types of data storage device known to one of ordinary skill in the art of electronics. The present invention may be practiced when the reloadable registers 412, 414, and 416 each are part of a respective separate data storage device or each are integral portions of a same data storage device, as would be apparent to one of ordinary skill in the art of electronics from the description herein. In addition, the OR-gate 438 is only an example of combinational logic of comparator output signals that may be gated as the VRS signal. In addition, a bit pattern comparator may compare the predetermined number of bits of the selected synchronization bit pattern to a same predetermined number of bits of the shifted recovered serial data (RSD) for other numbers of cycles of the recovered clock signal (SCLK), aside from just the example of comparing for every single cycle of the recovered clock signal (SCLK).

The present invention is limited only as defined in the following claims and equivalents thereof.

We claim:

1. A phase selection unit for generating a recovered clock signal, the phase selection unit comprising:
   a phase select signal generator for generating a plurality of phase select signals in response to a FWD (forward) signal and a BWD (backward) signal from a digital filter;
   wherein said digital filter asserts said FWD signal if the phase of a SDIN (serial digital input) signal leads the phase of said recovered clock signal;
   and wherein said digital filter asserts said BWD signal if the phase of said SDIN (serial digital input) signal lags the phase of said recovered clock signal;
   a first multiplexer for inputting a predetermined number of given clock signals arranged in a predetermined phase order and for outputting a first output clock signal and a second output clock signal with said first and second output clock signals each being one of said given clock signals;
   a first phase interpolator that receives said first and second output clock signals from said multiplexer to generate said recovered clock signal having a phase that is phase interpolated between the phases of said first and second output clock signals;

a multiplexer control circuit that controls said multiplexer to select one of said given clock signals for each of said first and second output clock signals, depending on whether said phase select signals indicates that said FWD signal is asserted or that said BWD signal is asserted such that the phase of said recovered clock signal generated from said phase interpolator increases when said FWD signal is asserted and decreases when said BWD signal is asserted and remains substantially constant when said FWD signal and said BWD signal are not asserted;

a second multiplexer for inputting said predetermined number of given clock signals and for outputting a third output clock signal that has a 180° phase shift from said first output clock signal and for outputting a fourth output clock signal that has a 180° phase shift from said second output clock signal; and a second phase interpolator that receives said third and fourth output clock signals to generate a complementary recovered clock signal that has a 180° phase shift from said recovered clock signal and that has a phase that is phase interpolated between the phases of said third and fourth output clock signals.

2. The phase selection unit of claim 1:

wherein said phase select signal generator is comprised of a plurality of bidirectional flip flops with each flip flop having an output signal that is a respective one of said phase select signals;

and wherein said bidirectional flip flops are coupled together in a loop such that said phase select signals are arranged in a predetermined order with a selected one of said phase select signals being asserted as a currently asserted phase select signal with the rest of said phase select signals not being asserted;

and wherein a prior one from said currently asserted phase select signal in said order of said phase select signals is asserted as a newly asserted phase select signal when said BWD signal is asserted;

and wherein a subsequent one from said currently asserted phase select signal in said order of said phase select signals is asserted as said newly asserted phase select signal when said FWD signal is asserted;

and wherein a currently recovered clock signal is one of a chosen clock signal of said given clock signals, a leading interpolated clock signal of said chosen clock signal, or a lagging interpolated clock signal of said chosen clock signal, and wherein said leading interpolated clock signal of said chosen clock signal has a phase that is an average of the phase of said chosen clock signal and the phase of an adjacent leading clock signal in said predetermined phase order of said given clock signals;

and wherein said lagging interpolated clock signal of said chosen clock signal has a phase that is an average of the phase of said chosen clock signal and the phase of an adjacent lagging clock signal in said predetermined phase order of said given clock signals;

and wherein when said currently recovered clock signal is said chosen clock signal, said multiplexer control circuit controls said multiplexer to select said chosen clock signal as said first output clock signal and to select said adjacent leading clock signal of said chosen clock signal as said second output clock signal, such that a newly recovered clock signal generated by said phase interpolator is said leading interpolated clock signal of said chosen clock signal when said phase select signals indicate that said FWD signal is asserted;

and wherein when said currently recovered clock signal is said chosen clock signal, said multiplexer control circuit controls said multiplexer to select said chosen clock signal as said second output clock signal and to select said adjacent lagging clock signal of said chosen clock signal as said first output clock signal, such that said newly recovered clock signal generated by said phase interpolator is said lagging interpolated clock signal of said chosen clock signal when said phase select signals indicate that said BWD signal is asserted;

and wherein when said currently recovered clock signal is one of said leading or lagging interpolated clock signals, said multiplexer control circuit controls said multiplexer to select, as said first and second output clock signals, an immediately leading one of said given clock signals having a phase that leads said currently recovered clock signal by a least phase amount, such that said newly recovered clock signal generated by said phase interpolator is said immediately leading one of said given clock signals when said phase select signals indicate that said FWD signal is asserted;

and wherein when said currently recovered clock signal is one of said leading or lagging interpolated clock signals, said multiplexer control circuit controls said multiplexer to select, as said first and second output clock signals, an immediately lagging one of said given clock signals having a phase that lags said currently recovered clock signal by a least phase amount, such that said newly recovered clock signal generated by said phase interpolator is said immediately lagging one of said given clock signals when said phase select signals indicate that said BWD signal is asserted.

3. The phase selection unit of claim 2, wherein a first one of said loop of said bidirectional flip flops is a set flip flop, and wherein the rest of said bidirectional flip flops are reset flip flops, such that the phase select signal corresponding to said first one of said loop of said bidirectional flip flops is asserted as said currently asserted phase select signal in response to a RST (reset) signal.

4. The phase selection unit of claim 3, wherein said loop of said bidirectional flip flops is a closed loop with said first one of said loop of said bidirectional flip flops being coupled to a last one of said loop of said bidirectional flip flops.

5. The phase selection unit of claim 1, further comprising:

a voltage controlled oscillator for generating said predetermined number of given clock signals sent to said multiplexer with any two adjacent given clock signals in said predetermined phase order of said given clock signals having a substantially same phase difference and with first and last given clock signals in said predetermined phase order of said given clock signals having said substantially same phase difference.

6. The phase selection unit of claim 1, wherein said phase selection unit comprises part of a DPLL (digital phase lock loop) within a SERDES (serializer/deserializer) transceiver.

7. A phase selection unit for generating a recovered clock signal, the phase selection unit comprising:

means for generating a plurality of phase select signals in response to a FWD (forward) signal and a BWD (backward) signal from a digital filter, wherein said digital filter asserts said FWD signal if the phase of a SDIN (serial digital input) signal leads the phase of said recovered clock signal;

and wherein said digital filter asserts said BWD signal if the phase of said SDIN (serial digital input) signal lags the phase of said recovered clock signal;

and wherein said phase select signals are arranged in a predetermined order with a selected one of said phase select signals being asserted as a currently asserted phase select signal with the rest of said phase select signals not being asserted;

and wherein a prior one from said currently asserted phase select signal in said order of said phase select signals is asserted as a newly asserted phase select signal when said BWD signal is asserted;

and wherein a subsequent one from said currently asserted phase select signal in said order of said phase select signals is asserted as said newly asserted phase select signal when said FWD signal is asserted;

means for generating said recovered clock signal having a phase that is phase interpolated between a first phase of a first output clock signal and a second phase of a second output clock signal; and means for selecting each of said first and second output clock signals as one of a predetermined number of given clock signals arranged in a predetermined phase order, depending on whether said phase select signals indicate that said FWD signal is asserted or that said BWD signal is asserted such that the phase of said recovered clock signal increases when said FWD signal is asserted and decreases when said BWD signal is asserted and remains substantially constant when said FWD signal and said BWD signal are not asserted; and means for generating a complementary recovered clock signal that has a 180° phase shift from said recovered clock signal and that has a phase that is phase interpolated between the phases of third and fourth output clock signals, wherein said third output clock signal has a 180° phase shift from said first output clock signal, and wherein said fourth output clock signal has a 180° phase shift from said second output clock signal.

8. The phase selection unit of claim 7:

wherein a currently recovered clock signal is one of a chosen clock signal of said given clock signals, a leading interpolated clock signal of said chosen clock signal, or a lagging interpolated clock signal of said chosen clock signal, and wherein said leading interpolated clock signal of said chosen clock signal has a phase that is an average of the phase of said chosen clock signal and the phase of an adjacent leading clock signal in said predetermined phase order of said given clock signals;

and wherein said lagging interpolated clock signal of said chosen clock signal has a phase that is an average of the phase of said chosen clock signal and the phase of an adjacent lagging clock signal in said predetermined phase order of said given clock signals;

and wherein when said currently recovered clock signal is said chosen clock signal, said chosen clock signal is selected as said first output clock signal, and said adjacent leading clock signal of said chosen clock signal is selected as said second output clock signal, such that a newly recovered clock signal is said leading interpolated clock signal of said chosen clock signal when said phase select signals indicate that said FWD signal is asserted;

and wherein when said currently recovered clock signal is said chosen clock signal, said chosen clock signal is selected as said second output clock signal, and said adjacent lagging clock signal of said chosen clock signal is selected as said first output clock signal, such that said newly recovered clock signal is said lagging interpolated clock signal of said chosen clock signal when said phase select signals indicate that said BWD signal is asserted;

and wherein when said currently recovered clock signal is one of said leading or lagging interpolated clock signals, an immediately leading one of said given clock signals having a phase that leads said currently recovered clock signal by a least phase amount is selected as said first and second output clock signals, such that said newly recovered clock signal generated by said phase interpolator is said immediately leading one of said given clock signals when said phase select signals indicate that said FWD signal is asserted;

and wherein when said currently recovered clock signal is one of said leading or lagging interpolated clock signals, an immediately lagging one of said given clock signals having a phase that lags said currently recovered clock signal by a least phase amount is selected as said first and second output clock signals, such that said newly recovered clock signal generated by said phase interpolator is said immediately lagging one of said given clock signals when said phase select signals indicate that said BWD signal is asserted.

9. The phase selection unit of claim 8, wherein a first one of said phase select signals is asserted as said currently asserted phase select signal in response to a RST (reset) signal.

10. The phase selection unit of claim 7, wherein said predetermined order of said phase select signals is a closed loop with a first phase select signal being adjacent a last phase select signal in said closed loop of said predetermined order of said phase select signals.

11. The phase selection unit of claim 7, further comprising:

means for generating said predetermined number of given clock signals with any two adjacent given clock signals in said predetermined phase order of said given clock signals having a substantially same phase difference and with first and last given clock signals in said predetermined phase order of said given clock signals having said substantially same phase difference.

12. The phase selection unit of claim 7, wherein said phase selection unit comprises part of a DPLL (digital phase lock loop) within a SERDES (serializer/deserializer) transceiver.

13. A method for generating a recovered clock signal, comprising:

generating a plurality of phase select signals in response to a FWD (forward) signal and a BWD (backward) signal from a digital filter;

wherein said digital filter asserts said FWD signal if the phase of a SDIN (serial digital input) signal leads the phase of said recovered clock signal;

and wherein said digital filter asserts said BWD signal if the phase of said SDIN (serial digital input) signal lags the phase of said recovered clock signal;

and wherein said phase select signals are arranged in a predetermined order with a selected one of said phase select signals being asserted as a currently asserted phase select signal with the rest of said phase select signals not being asserted;

and wherein a prior one from said currently asserted phase select signal in said order of said phase select signals is asserted as a newly asserted phase select signal when said BWD signal is asserted;

and wherein a subsequent one from said currently asserted phase select signal in said order of said phase select signals is asserted as said newly asserted phase select signal when said FWD signal is asserted;

generating said recovered clock signal having a phase that is phase interpolated between a first phase of a first output clock signal and a second phase of a second output clock signal;

selecting each of said first and second output clock signals as one of a predetermined number of given clock signals arranged in a predetermined phase order, depending on whether said phase select signals indicate that said FWD signal is asserted or that said BWD signal is asserted such that the phase of said recovered clock signal increases when said FWD signal is asserted and decreases when said BWD signal is asserted and remains substantially constant when said FWD signal and said BWD signal are not asserted; and generating a complementary recovered clock signal that has a 180° phase shift from said recovered clock signal and that has a phase that is phase interpolated between the phases of third and fourth output clock signals, wherein said third output clock signal has a 180° phase shift from said first output clock signal, and wherein said fourth output clock signal has a 180° phase shift from said second output clock signal.

14. The method of claim 13:

wherein a currently recovered clock signal is one of a chosen clock signal of said given clock signals, a leading interpolated clock signal of said chosen clock signal, or a lagging interpolated clock signal of said chosen clock signal, and wherein said leading interpolated clock signal of said chosen clock signal has a phase that is an average of the phase of said chosen clock signal and the phase of an adjacent leading clock signal in said predetermined phase order of said given clock signals;

and wherein said lagging interpolated clock signal of said chosen clock signal has a phase that is an average of the phase of said chosen clock signal and the phase of an adjacent lagging clock signal in said predetermined phase order of said given clock signals;

the method of claim 13 further comprising;

selecting when said currently recovered clock signal is said chosen clock signal, said chosen clock signal as said first output clock signal, and said adjacent leading clock signal of said chosen clock signal as said second output clock signal, such that a newly recovered clock signal is said leading interpolated clock signal of said chosen clock signal when said phase select signals indicate that said FWD signal is asserted;

selecting when said currently recovered clock signal is said chosen clock signal, said chosen clock signal as said second output clock signal, and said adjacent lagging clock signal of said chosen clock signal as said first output clock signal, such that said newly recovered clock signal is said lagging interpolated clock signal of said chosen clock signal when said phase select signals indicate that said BWD signal is asserted;

selecting when said currently recovered clock signal is one of said leading or lagging interpolated clock signals, an immediately leading one of said given clock signals having a phase that leads said currently recovered clock signal by a least phase amount as said first and second output clock signals, such that said newly recovered clock signal is said immediately leading one of said given clock signals when said phase select signals indicate that said FWD signal is asserted; and selecting when said currently recovered clock signal is one of said leading or lagging interpolated clock signals, an immediately lagging one of said given clock signals having a phase that lags said currently recovered clock signal by a least phase amount as said first and second output clock signals, such that said newly recovered clock signal is said immediately lagging one of said given clock signals when said phase select signals indicate that said BWD signal is asserted.

15. The method of claim 14, wherein said predetermined order of said phase select signals is a closed loop with a first phase select signal being adjacent a last phase select signal in said closed loop of said predetermined order of said phase select signals.

16. The method of claim 14, wherein a first one of said phase select signals is asserted as said currently asserted phase select signal in response to a RST (reset) signal.

17. The method of claim 13, further comprising:

generating said predetermined number of given clock signals with any two adjacent given clock signals in said predetermined phase order of said given clock signals having a substantially same phase difference and with first and last given clock signals in said predetermined phase order of said given clock signals having said substantially same phase difference.

18. The method of claim 13, wherein said recovered clock signal is an output of a DPLL (digital phase lock loop) within a SERDES (serializer/deserializer) transceiver.

* * * * *